(12) United States Patent
Ma et al.

(10) Patent No.: US 11,368,241 B2
(45) Date of Patent: Jun. 21, 2022

(54) COMMUNICATION METHOD AND COMMUNICATIONS APPARATUS

(71) Applicant: Huawei Technologies Co., Ltd., Shenzhen (CN)

(72) Inventors: Liang Ma, Shanghai (CN); Xin Zeng, Shenzhen (CN); Chen Zheng, Shanghai (CN); Xiaojian Liu, Shenzhen (CN); Yuejun Wei, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 232 days.

(21) Appl. No.: 16/787,958

(22) Filed: Feb. 11, 2020

(65) Prior Publication Data

US 2020/0177303 A1 Jun. 4, 2020

Related U.S. Application Data

(63) Continuation of application No. PCT/CN2018/099904, filed on Aug. 10, 2018.

(30) Foreign Application Priority Data

Aug. 11, 2017 (CN) .......................... 201710687631.9
Sep. 8, 2017 (CN) .......................... 201710807911.9

(51) Int. Cl.
*H04L 1/00* (2006.01)
*H03M 13/11* (2006.01)
*H03M 13/00* (2006.01)

(52) U.S. Cl.
CPC ....... *H04L 1/0005* (2013.01); *H03M 13/1177* (2013.01); *H03M 13/616* (2013.01); *H04L 1/0063* (2013.01)

(58) Field of Classification Search
CPC ... H04L 1/0005; H04L 1/0063; H04L 1/0016; H04L 1/0025; H04L 1/0057;
(Continued)

(56) References Cited

U.S. PATENT DOCUMENTS

2017/0026976 A1   1/2017  Yoo et al.
2018/0226989 A1*  8/2018  Soriaga .............. H03M 13/1102
(Continued)

FOREIGN PATENT DOCUMENTS

CN        1953335 A     4/2007
CN      101005334 A     7/2007
(Continued)

OTHER PUBLICATIONS

"NR LDPC design," 3GPP TSG RAN WG1 Meeting #89, Hangzhou, China, R1-1709534, XP051285403, pp. 1-13, 3rd Generation Partnership Project, Valbonne, France (May 15-19, 2017).
(Continued)

*Primary Examiner* — Pao Sinkantarakorn
*Assistant Examiner* — Kabir U Jahangir
(74) *Attorney, Agent, or Firm* — Leydig, Voit & Mayer, Ltd.

(57) ABSTRACT

Embodiments of this application disclose a communication method and a communications apparatus. The method includes: determining an encoding matrix type of a first sequence based on a modulation and encoding scheme (MCS) index, where the first sequence is obtained after code block segmentation is performed on a second sequence, a length of the second sequence is related to the MCS index, and a length of the first sequence is less than or equal to a first threshold; and encoding the first sequence based on the encoding matrix associated with the encoding matrix type. According to the application, the encoding matrix type can be properly selected for encoding.

19 Claims, 5 Drawing Sheets

(58) Field of Classification Search
CPC ... H04L 1/0003; H04L 1/0009; H04L 1/0013; H04L 1/0061; H04L 1/0071; H03M 13/1177; H03M 13/616; H03M 13/116; H03M 13/1185; H03M 13/6362; H03M 13/6516

See application file for complete search history.

(56) References Cited

U.S. PATENT DOCUMENTS

| | | | | |
|---|---|---|---|---|
| 2019/0268092 | A1* | 8/2019 | Byun | H03M 13/6393 |
| 2019/0312706 | A1* | 10/2019 | Nammi | H04L 5/0053 |
| 2020/0028523 | A1* | 1/2020 | Li | H03M 13/116 |
| 2020/0228237 | A1* | 7/2020 | Myung | H03M 13/6356 |

FOREIGN PATENT DOCUMENTS

| | | |
|---|---|---|
| CN | 101325474 A | 12/2008 |
| CN | 101764682 A | 6/2010 |
| CN | 102412842 A | 4/2012 |
| CN | 104168084 A | 11/2014 |
| CN | 105122655 A | 12/2015 |
| EP | 3661084 A1 | 6/2020 |
| JP | 2016506126 A | 2/2016 |
| WO | 2017065942 A1 | 4/2017 |
| WO | 2019018120 A1 | 1/2019 |

OTHER PUBLICATIONS

"3rd Generation Partnership Project; Technical Specification Group Radio Access Network; NR; Multiplexing and channel coding (Release 15)," 3GPP TS 38.212 V0.0.0, pp. 1-10, 3rd Generation Partnership Project, Valbonne, France (May 2017).

"Compact LDPC design for eMBB," 3GPP TSG RAN WG1 AH NR Meeting, Spokane, USA, R1-1701473 XP051222469, pp. 1-19, 3rd Generation Partnership Project, Valbonne, France (Jan. 16-20, 2017).

"WF on LDPC parity check matrices," 3GPP TSG RAN WG1 NR AH #2, Qingdao, China, R1-1711982, pp. 1-2, 3rd Generation Partnership Project, Valbonne, France (Jun. 27-30, 2017).

"LDPC Coding chain," 3GPP TSG RAN WG1 Meeting NR-Adhoc#2, Qingdao, P.R. China, R1-1711344, XP051305812, pp. 1-5, 3rd Generation Partnership Project, Valbonne, France (Jun. 27-30, 2017).

* cited by examiner

FIG. 1

COMMUNICATION METHOD AND COMMUNICATIONS APPARATUS

CROSS-REFERENCE TO RELATED APPLICATIONS

This application is a continuation of International Application No. PCT/CN2018/099904, filed on Aug. 10, 2018, which claims priority to Chinese Patent Application No. 201710687631.9, filed on Aug. 11, 2017, and Chinese Patent Application No. 201710807911.9, filed on Sep. 8, 2017. All of the aforementioned patent applications are hereby incorporated by reference in their entireties.

TECHNICAL FIELD

Embodiments of this application relate to the communications field, and in particular, to a communication method and a communications apparatus.

BACKGROUND

A low-density parity-check (LDPC) code is a linear block code with a sparse check matrix, and is characterized by a flexible structure and low decoding complexity. Because the LDPC code uses a partially parallel iterative decoding algorithm, the LDPC code has a higher throughput than a conventional turbo code. The LDPC code may be used as an error-correcting code in a communications system, so as to increase channel transmission reliability and power utilization. The LDPC code may be further widely applied to space communication, optical fiber communication, personal communications systems, ADSLs, magnetic recording devices, and the like. The LDPC code has been currently considered as one of channel encoding modes in the 5th generation mobile communication.

During actual usage, an LDPC matrix characterized by a special structure may be used. The LDPC matrix H characterized by the special structure may be obtained by extending an LDPC base matrix with a quasi-cyclic (QC) structure. QC-LDPC is suitable for hardware with high parallelism, and provides a higher throughput. The LDPC matrix may be applied to channel coding through design.

QC-LDPC is suitable for hardware with high parallelism, and provides a higher throughput. The LDPC matrix may be applied to channel coding through design.

SUMMARY

Embodiments of this application provide a communication method and a communications apparatus, so that an encoding matrix type can be properly selected for encoding.

According to a first aspect, a communication method is provided, including: determining an encoding matrix type based on at least a length of a first sequence; and performing encoding on the first sequence based on an encoding matrix corresponding to the encoding matrix type. Further, when the length of the first sequence is less than or equal to a first threshold, the encoding matrix type may be determined based on a modulation and coding scheme (MCS) index. The first sequence is obtained after code block segmentation is performed on a second sequence, and a length of the second sequence is related to the MCS index.

In the foregoing method, the encoding matrix type is determined based on the length of the sequence input into an encoder and the MCS index, and the encoding matrix type is properly selected, to reduce a decoding delay and improve decoding performance on a premise of ensuring normal operation of a system.

In a possible design, when the length of the first sequence is less than or equal to the first threshold, the encoding matrix type corresponding to the MCS index is determined by using a correspondence between the MCS index and the encoding matrix type. In this solution, the encoding matrix type is bound to the MCS index, to increase robustness of a system.

Further, based on the foregoing manner, to more flexibly configure the encoding matrix type, for all or some MCS indexes, the encoding matrix type may be configured based on a granularity of $N_{PRB}$. For example, the MCS index corresponds to a plurality of $N_{PRB}$, and the number of $N_{PRB}$ is M, M is a positive integer, and the encoding matrix type is determined based on $N_{PRB}$ and the MCS index. In a possible manner, for each MCS index in all the MCS indexes, $N_{PRB}$ whose value is less than or equal to a second threshold may correspond to a second encoding matrix type. In another possible manner, for some MCS indexes, for example, the encoding matrix type may be configured based on the granularity of $N_{PRB}$ for an MCS index in which a difference between at least two of M code rates is greater than a third threshold. Specifically, $N_{PRB}$ whose value is less than or equal to a second threshold may correspond to a second encoding matrix type.

In another possible design, a code rate corresponding to the MCS index is determined by using a correspondence between the MCS index and the code rate, and the encoding matrix type is determined based on the code rate and a code rate threshold. The code rate and the code rate threshold may be floating point numbers or fractions. When the code rate is a fraction, a numerator value corresponding to the code rate is recorded in the correspondence between the MCS index and the code rate.

In still another possible design, a code rate index corresponding to the MCS index may be determined by using a correspondence between the MCS index and the code rate index, a code rate corresponding to the code rate index is searched for based on the code rate index, and the encoding matrix type is determined based on the code rate and a code rate threshold.

That the encoding matrix type is determined based on the code rate and the code rate threshold may be: comparing the code rate with the code rate threshold to determine the encoding matrix type. For example, when the code rate is greater than the code rate threshold, a first encoding matrix type is selected; or when the code rate is less than or equal to the code rate threshold, the second encoding matrix type is selected. In the foregoing manner, calculating the code rate each time the encoding matrix type is determined can also be avoided, and the MCS index is indirectly bound to the encoding matrix type, so that robustness of a system can be increased.

In the foregoing method, a size of an encoding matrix corresponding to the first encoding matrix type is greater than a size of an encoding matrix corresponding to the second encoding matrix type.

Each correspondence mentioned in the foregoing method may be stored in a table form.

In the foregoing method, the encoding matrix type is determined based on the MCS index in a table lookup manner.

The encoding matrix type in the foregoing method includes a base graph.

According to a second aspect, a communication method is further provided. The method is applicable to a decoding process, the decoding process corresponds to the communication method in the first aspect, and an encoding matrix type is determined in a manner that is the same as the manner in the communication method in the first aspect, so as to further determine an encoding matrix.

According to a third aspect, a communications apparatus is provided. The communications apparatus may include a corresponding module configured to perform the communication method designs in the first aspect or the second aspect. The module may be software and/or hardware.

In a possible design, the communications apparatus provided in the third aspect includes a processor and a transceiver component, and the processor and the transceiver component may be configured to implement functions in the foregoing encoding or decoding method. In this design, if the communications apparatus is a terminal, a base station, or another network device, the transceiver component of the communications apparatus may be a transceiver. If the communications apparatus is a baseband chip or a baseband processing board, the transceiver component of the communications apparatus may be an input/output circuit of the baseband chip or the baseband processing board, and is configured to receive/send an input/output signal. Optionally, the communications apparatus may further include a memory, configured to store data and/or an instruction.

The communications apparatus may be the chip, the terminal, or the base station.

According to a fourth aspect, an embodiment of this application provides a communications system, and the system includes the communications apparatus in the third aspect.

According to another aspect, an embodiment of this application provides a computer storage medium. The computer storage medium stores a program, and when the program runs, a computer performs the methods in the foregoing aspects.

Still another aspect of this application provides a computer program product that includes an instruction. When the instruction runs on a computer, the computer performs the methods in the foregoing aspects.

BRIEF DESCRIPTION OF DRAWINGS

FIG. 1 is a schematic diagram of a base graph of an LDPC code;

DESCRIPTION OF EMBODIMENTS

Figure 2:
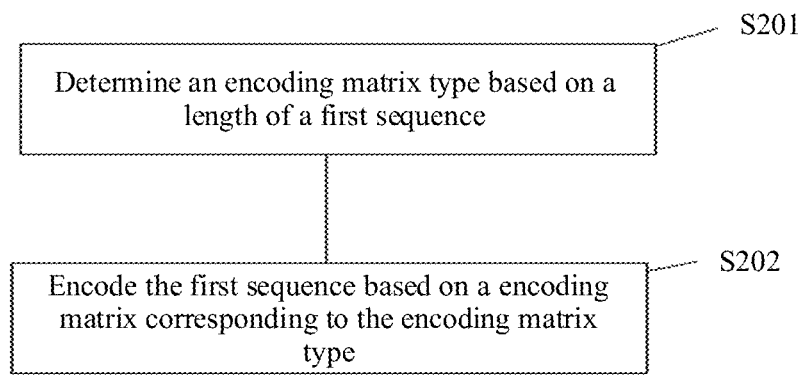
FIG. 2 is a schematic diagram of a communication method according to an embodiment of this application.

For ease of understanding, some nouns in this application are described below.

In this application, nouns "network" and "system" are usually interchangeably used, and "apparatus" and "device" are also usually interchangeably used, but meanings of the nouns can be understood by a person skilled in the art. A "communications apparatus" may be a chip (such as a baseband chip, a data signal processing chip, or a general-purpose chip), a terminal, a base station, or another network device. A terminal is a device having a communication function, and may include a handheld device, an in-vehicle device, a wearable device, a computing device, another processing device connected to a wireless modem, or the like that has a wireless communication function. The terminal may have different names in different networks, for example, user equipment, a mobile station, a subscriber unit, a station, a cellular phone, a personal digital assistant, a wireless modem, a wireless communications device, a handheld device, a laptop computer, a cordless phone, and a wireless local loop station. For ease of description, these devices are simply referred to as the terminal in this application. A base station ((BS) may also be referred to as a base station device, and is a device deployed in a radio access network to provide a wireless communication function. In different radio access systems, names of the base station may be different. For example, a base station in a universal mobile telecommunications system (UMTS) is referred to as a NodeB, a base station in an LTE network is referred to as an evolved NodeB (eNB, or eNodeB), a base station in a new radio (NR) network is referred to as a transmission reception point (TRP) or a next-generation NodeB (gNB), or a base station in other various evolved networks may also be referred to as other names. This application is not limited thereto.

The following describes some terms and concepts in this application.

A sequence is a bit string including a bit "0" and/or a bit "1". A length of the sequence is a quantity of bits included in the sequence. For example, a sequence 00 includes two bits, and a length of the sequence 00 is 2. A sequence 111 includes three bits, and a length of the sequence 111 is 3. A sequence "0100" includes four bits, and a length of the sequence "0100" is 4.

Both a transport block (TB) and a code block (CB) may be considered as a sequence. The code block is obtained after the transport block or a processed transport block is segmented, and is an object of encoding. Therefore, in this application, a code block length is a quantity of bits included in the code block, and the code block length may also be referred to as a code block size (CBS). A transport block length is a quantity of bits included in the transport block, and the transport block length may also be referred to as a transport block size (TBS). It may be understood that with development of technologies, the transport block or the code block may have different names. In the embodiments of this application, a transport block obtained after processing may also be understood as a transport block, and the processing may be adding a check bit, for example, adding a cyclic redundancy check (CRC) bit, based on an initial transport block. This is not limited in the embodiments of this application.

In the embodiments of this application, a mentioned code rate is a code rate used for a to-be-coded sequence.

An LDPC code may usually be represented by using a parity check matrix (sometimes referred to as a base matrix). The parity check matrix of the LDPC code may be agreed on by using a protocol, pre-configured, or pre-stored. The parity check matrix of the LDPC code may be alternatively represented by using a base graph (BG for short) and a shift value $V_{i,j}$. The base graph (BG for short) and the shift value $V_{i,j}$ may be agreed on by using a protocol, pre-configured, or pre-stored.

In an implementation, both the parity check matrix and the base graph may be represented in an m-row and n-column matrix form, and m and n are positive integers. A size of the parity check matrix and a size of the base graph may be represented by using a quantity of rows and a quantity of columns of a matrix, or may be represented by using a quantity of included matrix elements. The size of the parity check matrix may correspond to the size of the base graph. The size corresponding may be understood that a quantity of rows and a quantity of columns of the parity check matrix are respectively the same as a quantity of rows and a quantity of columns of the base graph, or may be understood that a quantity of rows and a quantity of columns of the parity check matrix respectively correspond to a quantity of rows and a quantity of columns of the base graph.

Figure 1:
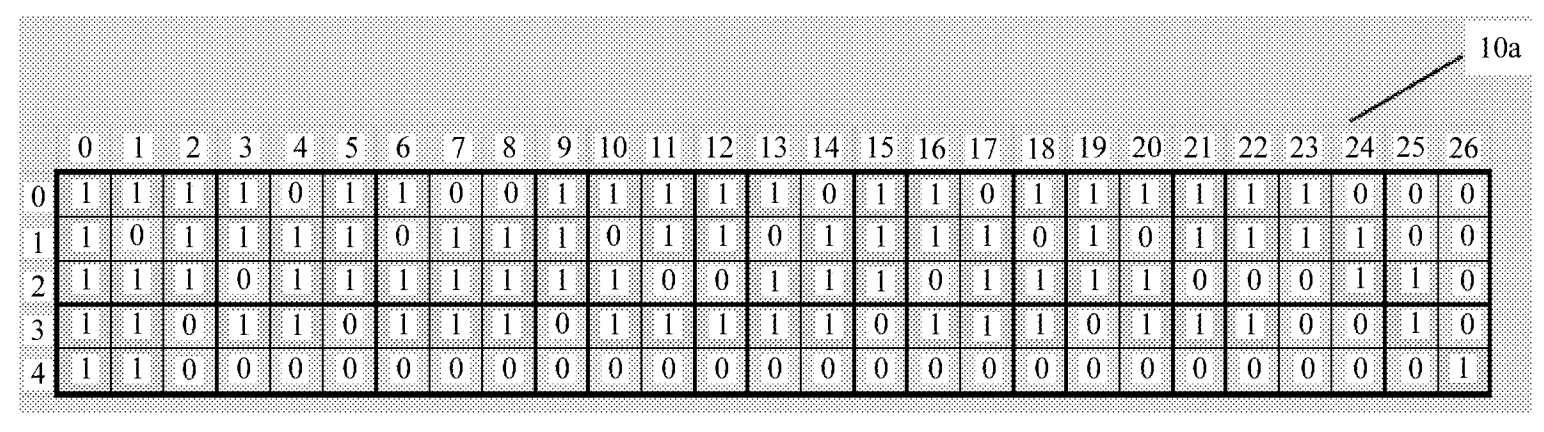

The base graph may usually include m*n matrix elements (entry), and a value of a matrix element is 0 or 1. An element whose value is 0 may also be represented by null and is sometimes referred to as a zero element, which indicates that the element may be replaced by a Z*Z all-zero matrix. An element whose value is 1 is sometimes referred to as a non-zero element, and the non-zero element may be replaced by the shift value $V_{i,j}$, where i is a row index (row number) and j is a column index (column number). The base graph may be used to indicate a location of the shift value, and the non-zero element in the base graph corresponds to the shift value. As shown in FIG. 1, 10a is an example of a 5-row and 27-column base graph, that is, m=5, and n=27. In this specification, both row indexes (row number) and column indexes (column number) of the base graph and the base matrix are numbered starting from 0. It may be understood that the row number and the column number may also be numbered starting from 1 or another value provided that the row number and the column number can be indexed to a corresponding row and column.

A required BG size may vary according to different system requirements. BGs may be classified based on the BG size. For example, a BG type may be stipulated by a protocol, pre-defined, pre-configured, or pre-stored, and each type of BG has a different size (in other words, the quantity of rows and/or the quantity of columns of the matrix are/is different). For example, it may be stipulated that two types of BGs are included, that is, a BG 1 and a BG 2; or more than two types of BGs, such as a BG 1, a BG 2, and a BG 3, may be stipulated. A quantity of BG types is not limited in this application.

In an implementation, a size of a parity check matrix $H_{BG1}$ corresponding to the BG 1 is 46 rows and 68 columns, a row index is i=0, 1, 2, . . . , 45, and a column index is j=0, 1, 2, . . . , 67. A size of a parity check matrix $H_{BG2}$ corresponding to the BG 2 is 42 rows and 52 columns, a row index is i=0, 1, 2, . . . , 41, and a column index is j=0, 1, 2, . . . , 51.

Table 1 shows a possible form of location distribution of non-zero elements of $H_{BG}$ corresponding to the BG 1 and the BG 2 respectively.

TABLE 1

$H_{BG}$ of the BG 1 and the BG 2

| Row index (i) | Column index of a non-zero element in the base graph 1 | Column index of a non-zero element in the base graph 2 |
| --- | --- | --- |
| 0 | 0, 1, 2, 3, 5, 6, 9, 10, 11, 12, 13, 15, 16, 18, 19, 20, 21, 22, 23 | 0, 1, 2, 3, 6, 9, 10, 11 |
| 1 | 0, 2, 3, 4, 5, 7, 8, 9, 11, 12, 14, 15, 16, 17, 19, 21, 22, 23, 24 | 0, 3, 4, 5, 6, 7, 8, 9, 11, 12 |
| 2 | 0, 1, 2, 4, 5, 6, 7, 8, 9, 10, 13, 14, 15, 17, 18, 19, 20, 24, 25 | 0, 1, 3, 4, 8, 10, 12, 13 |
| 3 | 0, 1, 3, 4, 6, 7, 8, 10, 11, 12, 13, 14, 16, 17, 18, 20, 21, 22, 25 | 1, 2, 4, 5, 6, 7, 8, 9, 10, 13 |
| 4 | 0, 1, 26 | 0, 1, 11, 14 |
| 5 | 0, 1, 3, 12, 16, 21, 22, 27 | 0, 1, 5, 7, 11, 15 |
| 6 | 0, 6, 10, 11, 13, 17, 18, 20, 28 | 0, 5, 7, 9, 11, 16 |
| 7 | 0, 1, 4, 7, 8, 14, 29 | 1, 5, 7, 11, 13, 17 |
| 8 | 0, 1, 3, 12, 16, 19, 21, 22, 24, 30 | 0, 1, 12, 18 |
| 9 | 0, 1, 10, 11, 13, 17, 18, 20, 31 | 1, 8, 10, 11, 19 |
| 10 | 1, 2, 4, 7, 8, 14, 32 | 0, 1, 6, 7, 20 |
| 11 | 0, 1, 12, 16, 21, 22, 23, 33 | 0, 7, 9, 13, 21 |
| 12 | 0, 1, 10, 11, 13, 18, 34 | 1, 3, 11, 22 |
| 13 | 0, 3, 7, 20, 23, 35 | 0, 1, 8, 13, 23 |
| 14 | 0, 12, 15, 16, 17, 21, 36 | 1, 6, 11, 13, 24 |
| 15 | 0, 1, 10, 13, 18, 25, 37 | 0, 10, 11, 25 |
| 16 | 1, 3, 11, 20, 22, 38 | 1, 9, 11, 12, 26 |
| 17 | 0, 14, 16, 17, 21, 39 | 1, 5, 11, 12, 27 |
| 18 | 1, 12, 13, 18, 19, 40 | 0, 6, 7, 28 |
| 19 | 0, 1, 7, 8, 10, 41 | 0, 1, 10, 29 |
| 20 | 0, 3, 9, 11, 22, 42 | 1, 4, 11, 30 |
| 21 | 1, 5, 16, 20, 21, 43 | 0, 8, 13, 31 |
| 22 | 0, 12, 13, 17, 44 | 1, 2, 32 |
| 23 | 1, 2, 10, 18, 45 | 0, 3, 5, 33 |
| 24 | 0, 3, 4, 11, 22, 46 | 1, 2, 9, 34 |
| 25 | 1, 6, 7, 14, 47 | 0, 5, 35 |
| 26 | 0, 2, 4, 15, 48 | 2, 7, 12, 13, 36 |
| 27 | 1, 6, 8, 49 | 0, 6, 37 |
| 28 | 0, 4, 19, 21, 50 | 1, 2, 5, 38 |
| 29 | 1, 14, 18, 25, 51 | 0, 4, 39 |
| 30 | 0, 10, 13, 24, 52 | 2, 5, 7, 9, 40 |
| 31 | 1, 7, 22, 25, 53 | 1, 13, 41 |
| 32 | 0, 12, 14, 24, 54 | 0, 5, 12, 42 |
| 33 | 1, 2, 11, 21, 55 | 2, 7, 10, 43 |
| 34 | 0, 7, 15, 17, 56 | 0, 12, 13, 44 |
| 35 | 1, 6, 12, 22, 57 | 1, 5, 11, 45 |
| 36 | 0, 14, 15, 18, 58 | 0, 2, 7, 46 |
| 37 | 1, 13, 23, 59 | 10, 13, 47 |
| 38 | 0, 9, 10, 12, 60 | 1, 5, 11, 48 |
| 39 | 1, 3, 7, 19, 61 | 0, 7, 12, 49 |
| 40 | 0, 8, 17, 62 | 2, 10, 13, 50 |
| 41 | 1, 3, 9, 18, 63 | 1, 5, 11, 51 |
| 42 | 0, 4, 24, 64 | |
| 43 | 1, 16, 18, 25, 65 | |
| 44 | 0, 7, 9, 22, 66 | |
| 45 | 1, 6, 10, 67 | |

It may be understood that, it may be learned from the foregoing that a base graph may be considered as a type of encoding matrix, and the base graph may be understood as a representation manner of an encoding matrix type. Certainly, the encoding matrix type may also include a type of the parity check matrix.

It should be noted that, in the embodiments of this application, an encoding matrix type represents an encoding matrix structure, and the encoding matrix structure herein includes a size of an encoding matrix, and location distribution, in the encoding matrix, of a zero element and/or a non-zero element in the encoding matrix. Each encoding matrix type may correspond to at least one encoding matrix, and the at least one encoding matrix corresponding to each encoding matrix type has a same structure. However, specific values of non-zero elements are not totally the same (that is, some are the same or all are different). For example, the BG 1 may correspond to eight encoding matrices. Certainly, in addition to the size and the location distribution, in the encoding matrix, of the zero element and/or the non-zero element in the encoding matrix, there may be another difference between different encoding matrix types. This is not limited in the embodiments of this application.

In the embodiments of this application, at least two encoding matrix types may be included. The following provides description by using an example in which there are two encoding matrix types: a first encoding matrix type and a second encoding matrix type.

In the embodiments of this application, a size of an encoding matrix corresponding to the first encoding matrix type is greater than a size of an encoding matrix corresponding to the second encoding matrix type. Due to different encoding matrix sizes, code block length ranges and code rate ranges that are supported by the encoding matrix types are designed to be different. Correspondingly, the BG 1 may correspond to the first encoding matrix type, and the BG 2 may correspond to the second encoding matrix type.

An example in which the first encoding matrix type is the BG 1 is used, a minimum code rate supported by the first encoding matrix type is 1/3, a maximum code rate may be at least 0.89, a supported minimum block length may be at least 512 bits, and a supported maximum block length is 8448 bits. An example in which the second encoding matrix type is the BG 2 is used, a minimum code rate supported by the second encoding matrix type is 1/5, a maximum code rate may be at least 0.67, a supported minimum block length may be 40 bits, and a supported maximum block length may be 2560 bits and may be extended to 3840 bits. Due to different encoding matrix sizes, when the encoding matrix types are implemented by using a same hardware architecture, decoding delays and throughputs of the encoding matrix types are different, and are mainly determined by a difference Kb between a quantity of columns and a quantity of rows of a matrix. For the BG 1, Kb=68−46=22. For the BG 2, Kb=52−42=10. Generally, when a code length and a code rate are the same, a smaller Kb value leads to a lower decoding delay and a higher throughput of a matrix. A proper idea for selecting an encoding matrix type is that when the code length and the code rate are the same and both encoding matrix types are supported, a matrix with a smaller Kb value (e.g., the second encoding matrix type) is preferably selected.

To provide a proper solution for determining an encoding matrix type, as shown in FIG. 2, an embodiment of this application provides a communication method. The communication method is implemented by using a communications apparatus. During uplink transmission, the communications apparatus may be a terminal or a chip that may be used by a terminal. During downlink transmission, the communications apparatus may be a base station or a chip that may be used by a base station. The communication method may include the following steps.

5201. Determine an encoding matrix type based on a length of a first sequence.

Herein, the first sequence may be understood as a to-be-coded sequence input into an encoder, and may be represented as $c_0, c_1, c_2, c_3, \ldots, c_{K-1}$. For example, the first sequence may be a code block obtained after code block segmentation is performed on a transport block, and a length of the first sequence is also a code block size (CBS). Herein, the transport block may also be referred to as a second sequence.

It should be noted that the code block segmentation described herein is a processing procedure in which a to-be-processed transport block is input and a to-be-coded sequence is output, where the to-be-coded sequence may be referred to as a code block. In other words, the code block segmentation may be understood as a processing procedure from the transport block to the code block.

It may be understood that the code block segmentation may be performed in different manners based on an actual requirement of a system. For example, a manner may be determining to segment the transport block into one or more code blocks based on whether a transport block size is greater than a segmentation threshold. It may be understood that even if the transport block size is less than the segmentation threshold, the transport block is retained as one code block, and this may also be considered that a code block segmentation operation is performed. It may be understood that the transport block may be processed or may not be processed before segmentation. Before the segmentation, the transport block may be processed by adding a check bit, for example, adding a CRC bit, based on an initial transport block. In addition, a code block obtained through the segmentation may be processed or may not be processed before being input into the encoder. Processing of the code block may be, for example, adding a check bit, for example, adding a CRC bit, or the processing of the code block may further include adding a padding bit. This is not limited in this embodiment of this application.

If the code block is processed by adding the check bit, the length of the first sequence in this case may be a code block length after the check bit is added, or may be a code block length before the check bit is added. This is not limited in this embodiment of this application.

In an implementation, a value of the segmentation threshold may be a preset fixed value, or the segmentation threshold may be directly or indirectly determined based on a modulation and encoding scheme (MCS) index. Directly determining the segmentation threshold based on the MCS index may be: searching for, based on a correspondence between the MCS index and the segmentation threshold, the segmentation threshold corresponding to the MCS index. Indirectly determining the segmentation threshold based on the MCS index may be: after a corresponding code rate is obtained based on the MCS index, determining the segmentation threshold based on the code rate. A manner of determining the segmentation threshold and the value of the segmentation threshold are not limited in this embodiment of this application. It may be understood that the MCS index may be an MCS index value, or may be an MCS index interval.

When the length of the first sequence is greater than a first threshold, the encoding matrix type may be determined as a first encoding matrix type.

When the length of the first sequence is less than or equal to a first threshold, the encoding matrix type may be determined based on the MCS index. In other words, when the encoding matrix type is determined based on the MCS index, the length of the first sequence is less than or equal to the first threshold.

In an implementation, a correspondence between the MCS index and the encoding matrix type may be established. The encoding matrix type is determined based on the MCS index and the correspondence.

For example, the correspondence between the MCS index and the encoding matrix type may be established in a manner such as protocol agreement, pre-configuration, pre-storage, or signaling.

There may be a direct correspondence or an indirect correspondence between the MCS index and the encoding matrix type.

For example, a correspondence list between the MCS index and the encoding matrix type is stored, and a corresponding encoding matrix type is determined in a table lookup manner.

The encoding matrix type determined in the foregoing manner may be referred to as an encoding matrix type of the first sequence.

It may be understood that the first threshold is a preset value, for example, may be 2560 or 3840. This is not limited in this embodiment of this application. It may be understood that, for different manners of defining the length of the first sequence, the first threshold may be differently set. For example, if the length of the first sequence does not include a code block length of the check bit, a sequence length of the check bit may be considered to be subtracted from the first threshold, for example, the first threshold may be 3816, 3824, 2536, or 2544. Alternatively, if the length of the first sequence does not include a code block length of the check bit, a value of the first threshold may also be set without considering subtracting a sequence length of the check bit, and comparison may be performed after the length of the first sequence or the first threshold is processed. For example, the length of the first sequence plus a second preset value is compared with the first threshold, or the length of the first sequence is compared with a value obtained after a second preset value is subtracted from the first threshold.

Optionally, a network device (such as a base station) may determine the MCS index based on a channel quality indicator (CQI) fed back by a terminal (e.g., the terminal feeds back the CQI in a scheduling process). The network device may obtain the transport block size, that is, a length of the second sequence, based on the determined MCS index.

In a possible implementation, a corresponding TBS index may be obtained based on the MCS index, and then the transport block size may be obtained based on the TBS index and $N_{PRB}$. $N_{PRB}$ represents a quantity of resource blocks (RB) allocated in a hybrid automatic repeat request (HARQ) process or a transmission process. When $N_{PRB}$ represents a quantity of resource blocks allocated in a transmission process, the quantity of resource blocks herein may be a quantity of actually allocated resource blocks, or may be a normalized quantity of resource blocks. For example, in new radio (NR), one resource block may be supported to include 72, 108, or 144 resource elements (RE), a quantity $N_{RE}$ of resource elements may be defined, and a normalized RB size may be defined as $N_{Normalized}=144$. In one case, if the system uses a configuration in which one resource block includes 144 REs, and a particular process includes a total of $N_{RE}=288$ REs, a normalized quantity of resource blocks included in the process is $N_{PRB}=N_{RE}/N_{Normalized}=2$, which is just a quantity of actually allocated resource blocks. In another case, if the system uses a configuration in which one resource block includes 72 REs, and a particular process includes a total of $N_{RE}=288$ REs, a normalized quantity of resource blocks included in the process is $N_{PRB}=N_{RE}/N_{Normalized}=2$. However, in this case, the process actually includes 288/72=4 resource blocks, and $N_{PRB}=2$ obtained through calculation herein is a quantity of resource blocks obtained through calculation after normalization according to $N_{Normalized}$ equal to 144.

It may be learned from the foregoing that the TBS is related to the MCS index. However, how to determine and obtain the TBS based on the MCS index is not limited in this embodiment of this application.

For example, Table 2 provides an example of a correspondence between the MCS index ($I_{MCS}$), the TBS index ($I_{TBS}$), and a modulation scheme ($Q_m$), and Table 3 provides an example of a correspondence between the TBS index ($I_{TBS}$) and $N_{PRB}$. The transport block size may be obtained based on Table 2 and Table 3. It may be understood that some variations are also made based on Table 2 or Table 3, or another form or content different from Table 2 or Table 3 is used to represent a corresponding correspondence, to obtain the transport block size. This is not limited in this embodiment of this application. For example, a column indicating the modulation scheme in Table 2 is optional.

TABLE 2

| MCS index $I_{MCS}$ | Modulation scheme $Q_m$ | TBS index $I_{TBS}$ |
|---|---|---|
| 0 | 2 | 0 |
| 1 | 2 | 1 |
| 2 | 2 | 2 |
| 3 | 2 | 3 |
| 4 | 2 | 4 |
| 5 | 2 | 5 |
| 6 | 2 | 6 |
| 7 | 2 | 7 |
| 8 | 2 | 8 |
| 9 | 2 | 9 |
| 10 | 4 | 9 |
| 11 | 4 | 10 |
| 12 | 4 | 11 |
| 13 | 4 | 12 |
| 14 | 4 | 13 |
| 15 | 4 | 14 |
| 16 | 4 | 15 |
| 17 | 6 | 15 |
| 18 | 6 | 16 |
| 19 | 6 | 17 |
| 20 | 6 | 18 |
| 21 | 6 | 19 |
| 22 | 6 | 20 |
| 23 | 6 | 21 |
| 24 | 6 | 22 |
| 25 | 6 | 23 |
| 26 | 6 | 24 |
| 27 | 6 | 25 |
| 28 | 6 | 26/26A |
| 29 | 2 | Reserved |
| 30 | 4 | |
| 31 | 6 | |

TABLE 3

| | $N_{PRB}$ | | | | | | | | | |
|---|---|---|---|---|---|---|---|---|---|---|
| $I_{TBS}$ | 21 | 22 | 23 | 24 | 25 | 26 | 27 | 28 | 29 | 30 |
| 0 | 568 | 600 | 616 | 648 | 680 | 712 | 744 | 776 | 776 | 808 |
| 1 | 744 | 776 | 808 | 872 | 904 | 936 | 968 | 1000 | 1032 | 1064 |
| 2 | 936 | 968 | 1000 | 1064 | 1096 | 1160 | 1192 | 1256 | 1288 | 1320 |
| 3 | 1224 | 1256 | 1320 | 1384 | 1416 | 1480 | 1544 | 1608 | 1672 | 1736 |
| 4 | 1480 | 1544 | 1608 | 1736 | 1800 | 1864 | 1928 | 1992 | 2088 | 2152 |
| 5 | 1864 | 1928 | 2024 | 2088 | 2216 | 2280 | 2344 | 2472 | 2536 | 2664 |
| 6 | 2216 | 2280 | 2408 | 2472 | 2600 | 2728 | 2792 | 2984 | 2984 | 3112 |
| 7 | 2536 | 2664 | 2792 | 2984 | 3112 | 3240 | 3368 | 3368 | 3496 | 3624 |
| 8 | 2984 | 3112 | 3240 | 3368 | 3496 | 3624 | 3752 | 3880 | 4008 | 4264 |
| 9 | 3368 | 3496 | 3624 | 3752 | 4008 | 4136 | 4264 | 4392 | 4584 | 4776 |

TABLE 3-continued

| $I_{TBS}$ | \multicolumn{10}{c}{$N_{PRB}$} | | | | | | | | | |
|---|---|---|---|---|---|---|---|---|---|---|
| | 21 | 22 | 23 | 24 | 25 | 26 | 27 | 28 | 29 | 30 |
| 10 | 3752 | 3880 | 4008 | 4264 | 4392 | 4584 | 4776 | 4968 | 5160 | 5352 |
| 11 | 4264 | 4392 | 4584 | 4776 | 4968 | 5352 | 5544 | 5736 | 5992 | 5992 |
| 12 | 4776 | 4968 | 5352 | 5544 | 5736 | 5992 | 6200 | 6456 | 6712 | 6712 |
| 13 | 5352 | 5736 | 5992 | 6200 | 6456 | 6712 | 6968 | 7224 | 7480 | 7736 |
| 14 | 5992 | 6200 | 6456 | 6968 | 7224 | 7480 | 7736 | 7992 | 8248 | 8504 |
| 15 | 6456 | 6712 | 6968 | 7224 | 7736 | 7992 | 8248 | 8504 | 8760 | 9144 |
| 16 | 6712 | 7224 | 7480 | 7736 | 7992 | 8504 | 8760 | 9144 | 9528 | 9912 |
| 17 | 7480 | 7992 | 8248 | 8760 | 9144 | 9528 | 9912 | 10296 | 10296 | 10680 |
| 18 | 8248 | 8760 | 9144 | 9528 | 9912 | 10296 | 10680 | 11064 | 11448 | 11832 |
| 19 | 9144 | 9528 | 9912 | 10296 | 10680 | 11064 | 11448 | 12216 | 12576 | 12960 |
| 20 | 9912 | 10296 | 10680 | 11064 | 11448 | 12216 | 12576 | 12960 | 13536 | 14112 |
| 21 | 10680 | 11064 | 11448 | 12216 | 12576 | 12960 | 13536 | 14112 | 14688 | 15264 |
| 22 | 11448 | 11832 | 12576 | 12960 | 13536 | 14112 | 14688 | 15264 | 15840 | 16416 |
| 23 | 12216 | 12576 | 12960 | 13536 | 14112 | 14688 | 15264 | 15840 | 16416 | 16992 |
| 24 | 12960 | 13536 | 14112 | 14688 | 15264 | 15840 | 16416 | 16992 | 17568 | 18336 |
| 25 | 13536 | 14112 | 14688 | 15264 | 15840 | 16416 | 16992 | 17568 | 18336 | 19080 |
| 26 | 15264 | 16416 | 16992 | 17568 | 18336 | 19080 | 19848 | 20616 | 21384 | 22152 |
| 26A | 13536 | 14112 | 15264 | 15840 | 16416 | 16992 | 17568 | 18336 | 19080 | 19848 |

In another possible implementation, a correspondence between the MCS index and the code rate may be established, the code rate is determined based on the correspondence between the MCS index and the code rate, and the TBS is further determined based on the code rate and $N_{PRB}$. For example, the correspondence between the MCS index and the code rate may be established in a manner such as protocol agreement, pre-configuration, pre-storage, or signaling indication.

The MCS index may also be referred to as an MCS level.

The network device (such as the base station) may send the determined MCS index to the terminal, so that the terminal may determine the encoding matrix type by using the received MCS index.

S202. Encode the first sequence based on an encoding matrix corresponding to the encoding matrix type.

After the encoding matrix type is determined, the first sequence may be coded based on the encoding matrix corresponding to the determined encoding matrix type. Optionally, the encoding matrix may be determined based on a value of a lifting factor, and the value of the lifting factor may be determined based on a code block length obtained after the code block segmentation.

When a same hardware architecture is used to support code words with a same code length and a same code rate, different encoding matrix types have different decoding delays, and also have some differences in decoding performance. In addition, different encoding matrix types support different code block lengths and different code rates, and even for a code rate and a block length that are supported by all the different encoding matrix types, the different encoding matrix types have different decoding delays and different decoding performance. In the communication method provided in this embodiment of this application, the encoding matrix type is determined by using the length of the sequence input into the encoder and the MCS index, and the encoding matrix type is properly selected, to reduce a decoding delay and improve decoding performance on a premise of ensuring normal operation of the system.

Optionally, when the length of the first sequence is less than or equal to the first threshold, the encoding matrix type may be determined based on the MCS index in one of the following manners.

Manner (1): The encoding matrix type corresponding to the MCS index is determined by using the correspondence between the MCS index and the encoding matrix type. Optionally, the correspondence between the MCS index and the encoding matrix type may be stored in a memory of the communications apparatus, and each encoding matrix type is represented by a different value. For example, the correspondence between the MCS index and the encoding matrix type may be shown in Table 4. In Table 4, an encoding matrix type corresponding to a value "2" may be referred to as a second encoding matrix type, and an encoding matrix type corresponding to a value "1" may be referred to as the first encoding matrix type. It may be understood that another form or content different from Table 4 may be used to represent the correspondence between the MCS index and the encoding matrix type. This is not limited in this embodiment of this application. In addition, columns indicating the modulation scheme and the TBS index in Table 4 are optional. It may be understood that the correspondence between the MCS index and the encoding matrix type in this embodiment of this application may be a correspondence between the MCS index value and the encoding matrix type, or may be a correspondence between the MCS index interval and the encoding matrix type. This is not limited in this embodiment of this application.

TABLE 4

| MCS index $I_{MCS}$ | Modulation scheme $Q_m$ | TBS index $I_{TBS}$ | Encoding matrix type |
|---|---|---|---|
| 0 | 2 | 0 | 2 |
| 1 | 2 | 1 | 2 |
| 2 | 2 | 2 | 2 |
| 3 | 2 | 3 | 2 |
| 4 | 2 | 4 | 2 |
| 5 | 2 | 5 | 2 |
| 6 | 2 | 6 | 2 |
| 7 | 2 | 7 | 2 |
| 8 | 2 | 8 | 2 |
| 9 | 2 | 9 | 2 |
| 10 | 4 | 9 | 2 |
| 11 | 4 | 10 | 2 |
| 12 | 4 | 11 | 2 |
| 13 | 4 | 12 | 2 |
| 14 | 4 | 13 | 2 |
| 15 | 4 | 14 | 2 |
| 16 | 4 | 15 | 2 |
| 17 | 6 | 15 | 2 |
| 18 | 6 | 16 | 2 |

TABLE 4-continued

| MCS index $I_{MCS}$ | Modulation scheme $Q_m$ | TBS index $I_{TBS}$ | Encoding matrix type |
|---|---|---|---|
| 19 | 6 | 17 | 2 |
| 20 | 6 | 18 | 2 |
| 21 | 6 | 19 | 2 |
| 22 | 6 | 20 | 2 |
| 23 | 6 | 21 | 2 |
| 24 | 6 | 22 | 2 |
| 25 | 6 | 23 | 2 |
| 26 | 6 | 24 | 1 |
| 27 | 6 | 25 | 1 |
| 28 | 6 | 26/26A | 1 |
| 29 | 2 | Reserved | |
| 30 | 4 | | |
| 31 | 6 | | |

It may be understood that complete information about the correspondence between the MCS index and the encoding matrix type in Table 4 may be stored in the memory. However, to further reduce memory occupation, only some information may be stored. For example, in Table 4, only an MCS index and other information that are related to the encoding matrix type corresponding to the value "1" are stored, and an encoding matrix type corresponding to another MCS index that is not stored is the second encoding matrix type. Optionally, the correspondence in Table 4 may also be simplified as a form of Table 5, and another MCS index that is not listed in Table 5 corresponds to an encoding matrix type "2."

TABLE 5

| MCS index $I_{MCS}$ | Modulation scheme $Q_m$ | TBS index $I_{TBS}$ | Encoding matrix type |
|---|---|---|---|
| 26 | 6 | 24 | 1 |
| 27 | 6 | 25 | 1 |
| 28 | 6 | 26/26A | 1 |
| 29 | 2 | Reserved | |
| 30 | 4 | | |
| 31 | 6 | | |

A storage manner or a representation form of the correspondence is not limited in this embodiment of this application.

Optionally, the correspondence may be obtained through calculation by considering a code rate corresponding to each MCS index. For example, if post-encoding code rates of all TBSs corresponding to an MCS index are less than a code rate threshold, the MCS index may correspond to the second encoding matrix type, for example, a BG 2. If post-encoding code rates of all TBSs corresponding to a particular MCS index are greater than a code rate threshold, the MCS index corresponds to the first encoding matrix type, for example, a BG 1. If some of post-encoding code rates of TBSs corresponding to a particular MCS index are greater than a code rate threshold, and some are less than the code rate threshold, or an average value of post-encoding code rates corresponding to a particular MCS index is slightly greater than a code rate threshold, an encoding matrix type corresponding to the MCS index may be set to the first encoding matrix type or the second encoding matrix type based on an actual situation. This is not limited in this embodiment of this application.

The code rate is related to many parameters, including a quantity of RBs allocated by the system, a quantity of information symbols carried in each RB, a modulation order, and the like. When different system configurations or different calculation precision are used, code rates obtained through calculation may be different. If a method in which the code rate is calculated and is compared with the code rate threshold each time before the encoding matrix type is selected is used, a calculation process is cumbersome, and in addition, robustness of the system may be reduced due to inconsistent understanding and different precision of a transmit end and a receive end. However, in this embodiment of this application, the encoding matrix type is bound to the MCS index, and the robustness of the system can be increased because MCS indexes of the transmit end and the receive end can be aligned by using control signaling. In addition, expected code rates for each MCS index are very close, and the encoding matrix type corresponding to the MCS index may be determined through pre-configuration.

The code rate threshold may be a pre-defined value, for example, 2/3. Optionally, during actual calculation, a specific margin may be left on the pre-defined value, for example, 2/3 is raised to 0.7.

Further, one MCS index may correspond to $M \times N_{PRB}$. To more flexibly configure the encoding matrix type, for all or some MCS indexes, the encoding matrix type may be configured based on a granularity of $N_{PRB}$. Therefore, the encoding matrix type may be determined based on $N_{PRB}$ and the MCS index. M is a positive integer.

In a possible manner, for each MCS index in all the MCS indexes, $N_{PRB}$ whose value is less than or equal to a second threshold corresponds to the second encoding matrix type, for example, the BG 2, and $N_{PRB}$ whose value is greater than the second threshold corresponds to the first encoding matrix type, for example, the BG 1.

In another possible manner, for some MCS indexes, for example, the encoding matrix type may be configured based on the granularity of $N_{PRB}$ for an MCS index in which a difference between at least two of M code rates is greater than a third threshold. Specifically, $N_{PRB}$ whose value is less than or equal to a second threshold may correspond to the second encoding matrix type, for example, the BG 2, and $N_{PRB}$ whose value is greater than the second threshold corresponds to the first encoding matrix type, for example, the BG 1.

An example in which the MCS index is 26 is used. A possible form of configuring the encoding matrix type based on the granularity of $N_{PRB}$ may be shown in Table 6.

TABLE 6

| MCS index $I_{MCS}$ | Modulation scheme $Q_m$ | TBS index $I_{TBS}$ | $N_{PRB}$ | | | | |
|---|---|---|---|---|---|---|---|
| | | | 21 | 22 | 23 | 24 | 25 |
| 26 | 6 | 24 | 1 | 1 | 1 | 2 | 2 |

Manner (2): The code rate corresponding to the MCS index is determined by using the correspondence between the MCS index and the code rate, and the encoding matrix type is determined based on the code rate and a code rate threshold. Herein, the code rate threshold may be a pre-defined value, for example, 2/3.

Optionally, the correspondence between the MCS index and the code rate may be stored in the memory of the communications apparatus. For example, the correspondence between the MCS index and the code rate may be shown in Table 7. It may be understood that another form or content different from Table 7 may be used to represent the correspondence between the MCS index and the code rate. This is not limited in this embodiment of this application. In addition, columns indicating the modulation scheme and the TBS index in Table 7 are optional. It may be understood that the correspondence between the MCS index and the code rate in this embodiment of this application may be a correspondence between the MCS index value and the code rate, or may be a correspondence between the MCS index interval and the code rate. This is not limited in this embodiment of this application.

TABLE 7

| MCS index $I_{MCS}$ | Modulation scheme $Q_m$ | TBS index $I_{TBS}$ | Code rate Rj |
|---|---|---|---|
| 0 | 2 | 0 | R0 |
| 1 | 2 | 1 | R1 |
| 2 | 2 | 2 | R2 |
| 3 | 2 | 3 | R3 |
| 4 | 2 | 4 | R4 |
| 5 | 2 | 5 | R5 |
| 6 | 2 | 6 | R6 |
| 7 | 2 | 7 | R7 |
| 8 | 2 | 8 | R8 |
| 9 | 2 | 9 | R9 |
| 10 | 4 | 9 | R10 |
| 11 | 4 | 10 | R11 |
| 12 | 4 | 11 | R12 |
| 13 | 4 | 12 | R13 |
| 14 | 4 | 13 | R14 |
| 15 | 4 | 14 | R15 |
| 16 | 4 | 15 | R16 |
| 17 | 6 | 15 | R17 |
| 18 | 6 | 16 | R18 |
| 19 | 6 | 17 | R19 |
| 20 | 6 | 18 | R20 |
| 21 | 6 | 19 | R21 |
| 22 | 6 | 20 | R22 |
| 23 | 6 | 21 | R23 |
| 24 | 6 | 22 | R24 |
| 25 | 6 | 23 | R25 |
| 26 | 6 | 24 | R26 |
| 27 | 6 | 25 | R27 |
| 28 | 6 | 26/26A | R28 |
| 29 | 2 | Reserved | |
| 30 | 4 | | |
| 31 | 6 | | |

In Table 7, Rj represents a code rate. Usually, the code rate is a floating point number, and corresponding precision may be defined. For example, precision is defined as that four significant digits after a decimal point are rounded off.

Alternatively, the code rate may be defined as a fraction. For example, a denominator is defined as $2^t$, and a numerator value Rj corresponding to the code rate is recorded in the correspondence between the MCS index and the code rate, where $Rj<2^t$. In this manner, a maximum bit width of the code rate defined by using the fraction in a hardware implementation process is limited to t.

After the code rate is determined based on the MCS index, the code rate is compared with the code rate threshold to determine the encoding matrix type. For example, when the code rate is greater than the code rate threshold, the first encoding matrix type is selected; or when the code rate is less than or equal to the code rate threshold, the second encoding matrix type is selected.

It may be understood that, corresponding to different forms of representing the code rate, the code rate threshold may be represented in a corresponding form. For example, when the code rate is the floating point number, the code rate threshold is also represented by using a floating point number. When the code rate is the fraction, the code rate threshold may also be represented by using a fraction with a same bit width. In this way, only a numerator value of the code rate may be compared with a numerator value of the code rate threshold. Alternatively, if the code rate threshold and the code rate are represented in different forms, comparison may be performed after the code rate threshold or the code rate is converted.

In the foregoing manner, calculating the code rate each time the encoding matrix type is determined may also be avoided, and the MCS index is indirectly bound to the encoding matrix type, so that robustness of the system can be increased because MCS indexes of a transmit end and a receive end can be aligned by using control signaling.

Manner (3): A code rate index corresponding to the MCS index is determined by using a correspondence between the MCS index and the code rate index, a code rate corresponding to the code rate index is searched for based on the code rate index, and the encoding matrix type is determined based on the code rate and a code rate threshold. Optionally, the correspondence between the MCS index and the code rate index may be stored in the memory of the communications apparatus. For example, the correspondence between the MCS index and the code rate index may be shown in Table 8. It may be understood that another form or content different from Table 8 may be used to represent the correspondence between the MCS index and the code rate index. This is not limited in this embodiment of this application. In addition, columns indicating the modulation scheme and the TBS index in Table 8 are optional. It may be understood that the correspondence between the MCS index and the code rate index in this embodiment of this application may be a correspondence between the MCS index value and the code rate index, or may be a correspondence between the MCS index interval and the code rate index. This is not limited in this embodiment of this application.

TABLE 8

| MCS index $I_{MCS}$ | Modulation scheme $Q_w$ | TBS index $I_{TBS}$ | Code rate index |
|---|---|---|---|
| 0 | 2 | 0 | 0 |
| 1 | 2 | 1 | 1 |
| 2 | 2 | 2 | 2 |
| 3 | 2 | 3 | 3 |
| 4 | 2 | 4 | 4 |
| 5 | 2 | 5 | 5 |
| 6 | 2 | 6 | 6 |
| 7 | 2 | 7 | 7 |
| 8 | 2 | 8 | 8 |
| 9 | 2 | 9 | 9 |
| 10 | 4 | 9 | 10 |
| 11 | 4 | 10 | 11 |
| 12 | 4 | 11 | 12 |
| 13 | 4 | 12 | 13 |
| 14 | 4 | 13 | 14 |
| 15 | 4 | 14 | 15 |
| 16 | 4 | 15 | 16 |
| 17 | 6 | 15 | 17 |
| 18 | 6 | 16 | 18 |
| 19 | 6 | 17 | 19 |
| 20 | 6 | 18 | 20 |
| 21 | 6 | 19 | 21 |
| 22 | 6 | 20 | 22 |
| 23 | 6 | 21 | 23 |
| 24 | 6 | 22 | 24 |
| 25 | 6 | 23 | 25 |
| 26 | 6 | 24 | 26 |
| 27 | 6 | 25 | 27 |
| 28 | 6 | 26/26A | 28 |
| 29 | 2 | Reserved | |
| 30 | 4 | | |
| 31 | 6 | | |

Further, the corresponding code rate may be further searched for by using the code rate index, and the encoding matrix type is then determined based on the found code rate and the code rate threshold. To be specific, the code rate is compared with the code rate threshold to determine the encoding matrix type. For example, when the code rate is greater than the code rate threshold, the first encoding matrix type is selected; or when the code rate is less than or equal to the code rate threshold, the second encoding matrix type is selected. For forms of representing the code rate and the code rate threshold herein, refer to related descriptions in the manner (2). Details are not described herein again.

It may be understood that, in the foregoing manners (1) to (3), the mentioned correspondences may be represented in a table form, or may be represented in an array or another form. This is not limited in this embodiment of this application.

In addition, in the foregoing embodiment, the first encoding matrix type and the second encoding matrix type are used as an example for description, and there may be more encoding matrix types. This is not limited in this embodiment of this application. When there are more encoding matrix types, there may be more than one code rate threshold, so that more encoding matrix types can be selected.

Storage in the foregoing embodiment of this application may be storage in one or more memories. The one or more memories may be separately disposed, or may be integrated into the encoder or a decoder, a processor, the chip, the communications apparatus, or the terminal. Alternatively, some of the one or more memories may be separately disposed, and the others may be integrated into a decoder, a processor, the chip, the communications apparatus, or the terminal. A type of the memory may be any form of storage medium. This is not limited in this embodiment of this application.

Further, in this embodiment of this application, a plurality of encoding schemes may be used based on the encoding matrix, and the following gives a description.

In an implementation, the encoding matrix may be considered as a check matrix that includes a shift value and that is obtained by extending a base graph.

Figure 3:
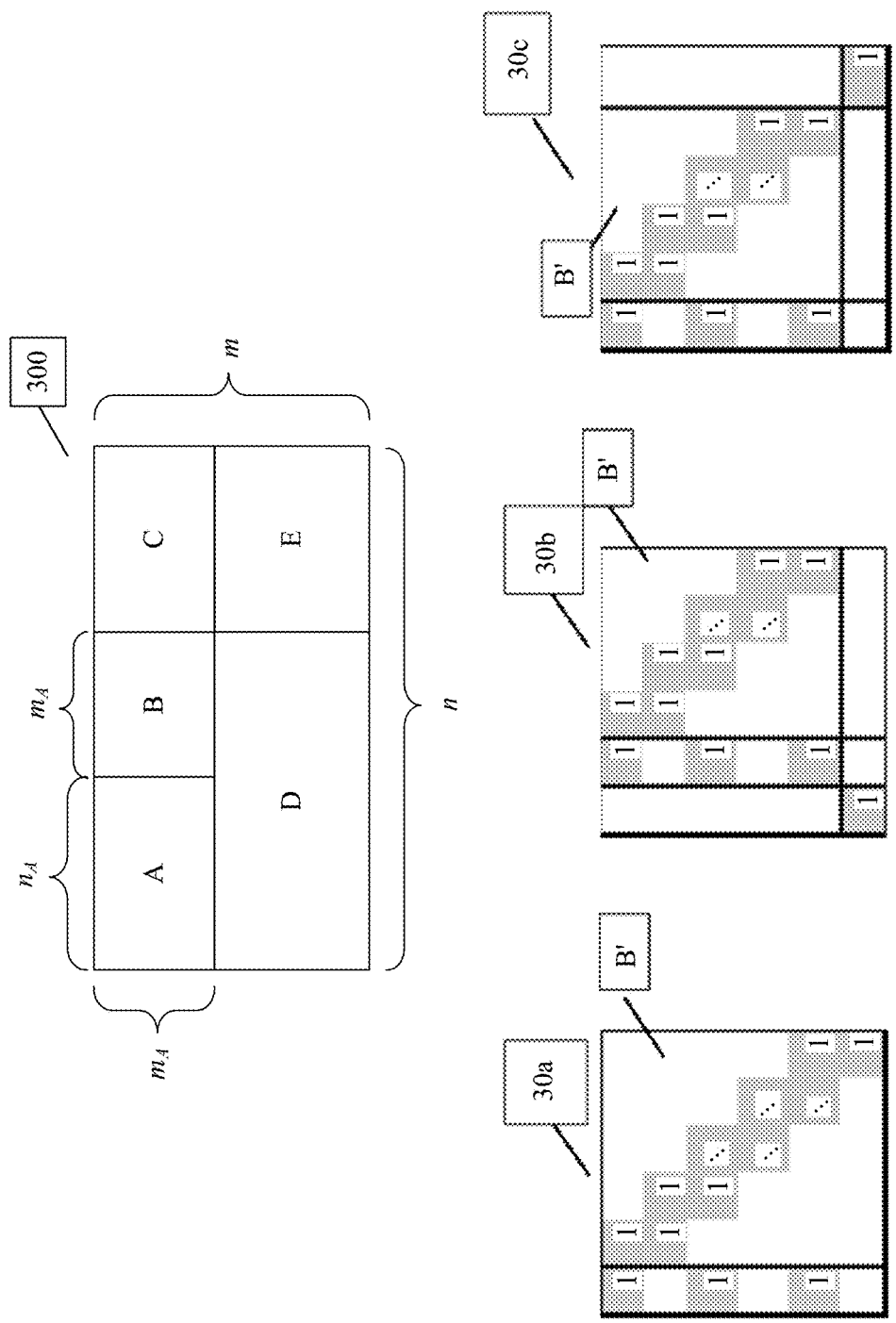
FIG. 3 is a schematic structural diagram of a base graph of an LDPC code.

For an LDPC code used in a wireless communications system, it is assumed that a matrix dimension of a base graph of the LDPC code is m*n, and the base graph may include five submatrices A, B, C, D, and E. A matrix weight is determined by a quantity of non-zero elements. A row weight is a quantity of non-zero elements included in a row, and a column weight is a quantity of non-zero elements included in a column, as shown in 300 in FIG. 3.

The submatrix A is an $m_A$-row and $n_A$-column matrix, and the submatrix A may have dimensions of $m_A*n_A$. Each column corresponds to Z system bits in the LDPC code, and the system bit is sometimes referred to as an information bit.

The submatrix B is an $m_A$-row and $m_A$-column square matrix, and the submatrix B may have dimensions of $m_A*m_A$. Each column corresponds to Z check bits in the LDPC code. The submatrix B includes a submatrix B with a bi-diagonal structure and a matrix column whose weight is 3 (simply referred to as a weight-3 column), and the matrix column whose weight is 3 may be located before the submatrix B, as shown in 30a in FIG. 3. The submatrix B may further include one or more matrix columns whose weight is 1 (simply referred to as a weight-1 column). For example, a possible implementation is shown in 30b or 30c in FIG. 3.

Usually, a matrix generated based on the submatrix A and the submatrix B is a core matrix, and may be used to support high code-rate encoding.

The submatrix C is an all-zero matrix, and the submatrix C has dimensions of $m_A \times m_D$.

The submatrix E is an identity matrix, and the submatrix E has dimensions of $m_D \times m_D$.

The submatrix D has dimensions of $m_D \times (n_A + m_A)$, and may be usually used to generate a low code-rate check bit.

It may be understood that, the base graph is expressed mathematically, and because C is the all-zero matrix and E is the identity matrix, in a possible implementation, the matrix formed by the submatrix A and the submatrix B, or a matrix formed by the submatrix A, the submatrix B, and the submatrix D may be used to simply represent a base graph of a matrix for encoding or decoding.

Because structures of the submatrix C and the submatrix E are relatively determined, structures of the submatrix A, the submatrix B, and the submatrix D are one of factors affecting encoding and decoding performance of the LDPC code.

When an LDPC matrix with a raptor-like structure is used for encoding, in a possible implementation, the submatrix A and the submatrix B part, namely, the core matrix may be first coded to obtain a check bit corresponding to the submatrix B, and then the entire matrix is coded to obtain a check bit corresponding to the submatrix E. Because the submatrix B may include the submatrix B with the bi-diagonal structure and the matrix column whose weight is 1, during encoding, a check bit corresponding to the bi-diagonal structure may be first obtained, and then a check bit corresponding to the matrix column whose weight is 1 may be obtained.

In another implementation, the to-be-coded sequence may be coded for the determined encoding matrix in the following manner.

A to-be-coded input sequence c (the first sequence) is represented as $c_0, c_1, c_2, c_3, \ldots, c_{K-1}$, and an output sequence d obtained after the input sequence is coded by the encoder is represented as $d_0, d_1, d_2, \ldots, d_{N-1}$, where K and N are integers greater than 0, and K and N may be an integer multiple of a lifting factor $Z_c$. For example, for the BG 1, N=66 Zc, and K=22 Zc; and for the BG 2, N=50 Zc, and K=10 Zc.

An encoding process may be as follows:

(1) A base matrix index $i_{LS}$ is obtained based on a correspondence between the lifting factor Zc and an index of a parity check matrix, and the lifting factor Zc may be determined based on a length K of the input sequence.

For example, the correspondence between the lifting factor Zc and the index of the parity check matrix may be represented as follows:

| Set index ($i_{LS}$) | Set of lifting sizes |
|---|---|
| 1 | {2, 4, 8, 16, 32, 64, 128, 256} |
| 2 | {3, 6, 12, 24, 48, 96, 192, 384} |
| 3 | {5, 10, 20, 40, 80, 160, 320} |
| 4 | {7, 14, 28, 56, 112, 224} |
| 5 | {9, 18, 36, 72, 144, 288} |
| 6 | {11, 22, 44, 88, 176, 352} |
| 7 | {13, 26, 52, 104, 208} |
| 8 | {15, 30, 60, 120, 240} |

(2) Values are assigned to the first $K-2Z_c$ bits in the coded bit sequence d. Herein, the first $2Z_c$ padding bits of a to-be-coded bit segment need to be skipped, and it is necessary to consider that the to-be-coded bit segment may include a padding bit.

In an implementation, a value may be assigned in the following manner:

for k=$2Z_c$ to K−1
if $c_k \neq$<NULL>,
$d_{k-2Z_c}=c_k$;
else
$c_k=0$;
$d_{k-2Z_c}=$<NULL>;
end if
end for where k is an index value, k is an integer, <NULL> indicates a padding bit, and a value of the padding bit may be 0 or another preset value. Optionally, the padding bit may not be sent.

(3) N+$2Z_c$−K check bits w=[$w_0$, $w_1$, $w_2$, ..., $w_{N+2Z_c-K-1}$]$^T$ are generated, so that the check bits meet the following formula:

$$H \times \begin{bmatrix} c \\ w \end{bmatrix} = 0,$$

where c=[$c_0$, $c_1$, $c_2$, ..., $c_{K-1}$]$^T$, 0 indicates a column vector, values of all elements of the column vector are 0, H indicates a parity check matrix (encoding matrix), and the parity check matrix may be stipulated by a protocol, pre-configured, or pre-stored; H may be obtained by using the base matrix index; and there may be a plurality of manners of storing the parity check matrix, for example, the matrix may be stored, or a parameter related to the matrix may be stored, for example, a shift value is stored, and this is not limited in this embodiment of this application.

(4) for k=K to N+$2Z_c$−1
$d_{k-2Z_c}=w_{k-K}$;
end for

In still another implementation, the communications apparatus may not store the parity check matrix, but store a generator matrix that may be required, to perform encoding. If a to-be-coded bit segment is c=$c_0$, $c_1$, $c_2$, $c_3$, ..., $c_{K-1}$, and a coded bit segment is d=$d_0$, $d_1$, $d_2$, ..., $d_{N-1}$, the generator matrix G meets:

$$d = c \cdot G.$$

The generator matrix may be obtained through conversion from a check matrix H. For the check matrix H, a right side of the check matrix H may be converted into a diagonal matrix form through row-column conversion, which is represented as:

$$H=[P\,I] \qquad (2)$$

In this case, the generator matrix G corresponding to the check matrix H meets:

$$G=[I\,P^T] \qquad (3)$$

The check matrix H may be any check matrix, base matrix, or LDPC matrix in the foregoing embodiment. During encoding, the stored generator matrix G may be used, and the coded bit segment d=$d_0$, $d_1$, $d_2$, ..., $d_{N-1}$ is directly calculated by using the to-be-coded bit segment c=$c_0$, $c_1$, $c_2$, $c_3$, ..., $c_{K-1}$.

In still another implementation, during encoding, for a bi-diagonal part of the parity check matrix, encoding may be performed in any one of the foregoing manners, or encoding may be performed by storing a multi-row superposition matrix.

In still another implementation, a shift value matrix corresponding to each lifting factor Zc may be calculated based on $P_{i,j}=\mathrm{mod}(V_{i,j}, Z_c)$, and then a matrix corresponding to each lifting factor is stored for encoding and decoding.

The following table uses the BG 2 as an example to illustrate a possible value of $V_{i,j}$.

| | | $i_{LS}$ | | | | | | | |
|---|---|---|---|---|---|---|---|---|---|
| i | j | 1 | 2 | 3 | 4 | 5 | 6 | 7 | 8 |
| 0 | 0 | 9 | 174 | 0 | 72 | 3 | 156 | 143 | 145 |
|   | 1 | 117 | 97 | 0 | 110 | 26 | 143 | 19 | 131 |
|   | 2 | 204 | 166 | 0 | 23 | 53 | 14 | 176 | 71 |
|   | 3 | 26 | 66 | 0 | 181 | 35 | 3 | 165 | 21 |
|   | 6 | 189 | 71 | 0 | 95 | 115 | 40 | 196 | 23 |
|   | 9 | 205 | 172 | 0 | 8 | 127 | 123 | 13 | 112 |
|   | 10 | 0 | 0 | 0 | 1 | 0 | 0 | 0 | 1 |
|   | 11 | 0 | 0 | 0 | 0 | 0 | 0 | 0 | 0 |
| 1 | 0 | 167 | 27 | 137 | 53 | 19 | 17 | 18 | 142 |
|   | 3 | 166 | 36 | 124 | 156 | 94 | 65 | 27 | 174 |
|   | 4 | 253 | 48 | 0 | 115 | 104 | 63 | 3 | 183 |
|   | 5 | 125 | 92 | 0 | 156 | 66 | 1 | 102 | 27 |
|   | 6 | 226 | 31 | 88 | 115 | 84 | 55 | 185 | 96 |
|   | 7 | 156 | 187 | 0 | 200 | 98 | 37 | 17 | 23 |
|   | 8 | 224 | 185 | 0 | 29 | 69 | 171 | 14 | 9 |
|   | 9 | 252 | 3 | 55 | 31 | 50 | 133 | 180 | 167 |
|   | 11 | 0 | 0 | 0 | 0 | 0 | 0 | 0 | 0 |
|   | 12 | 0 | 0 | 0 | 0 | 0 | 0 | 0 | 0 |
| 2 | 0 | 81 | 25 | 20 | 152 | 95 | 98 | 126 | 74 |
|   | 1 | 114 | 114 | 94 | 131 | 106 | 163 | 163 | 31 |
|   | 3 | 44 | 117 | 99 | 46 | 92 | 107 | 47 | 3 |
|   | 4 | 52 | 110 | 9 | 191 | 110 | 32 | 183 | 53 |
|   | 8 | 240 | 114 | 108 | 91 | 111 | 142 | 132 | 155 |
|   | 10 | 1 | 1 | 1 | 0 | 1 | 1 | 1 | 0 |
|   | 12 | 0 | 0 | 0 | 0 | 0 | 0 | 0 | 0 |
|   | 13 | 0 | 0 | 0 | 0 | 0 | 0 | 0 | 0 |
| 3 | 1 | 8 | 136 | 38 | 185 | 120 | 53 | 36 | 239 |
|   | 2 | 58 | 175 | 15 | 6 | 121 | 174 | 48 | 171 |
|   | 4 | 158 | 113 | 102 | 36 | 22 | 174 | 18 | 95 |
|   | 5 | 104 | 72 | 146 | 124 | 4 | 127 | 111 | 110 |
|   | 6 | 209 | 123 | 12 | 124 | 73 | 17 | 203 | 159 |
|   | 7 | 54 | 118 | 57 | 110 | 49 | 89 | 3 | 199 |
|   | 8 | 18 | 28 | 53 | 156 | 128 | 17 | 191 | 43 |
|   | 9 | 128 | 186 | 46 | 133 | 79 | 105 | 160 | 75 |
|   | 10 | 0 | 0 | 0 | 1 | 0 | 0 | 0 | 1 |
|   | 13 | 0 | 0 | 0 | 0 | 0 | 0 | 0 | 0 |
| 4 | 0 | 179 | 72 | 0 | 200 | 42 | 86 | 43 | 29 |
|   | 1 | 214 | 74 | 136 | 16 | 24 | 67 | 27 | 140 |
|   | 11 | 71 | 29 | 157 | 101 | 51 | 83 | 117 | 180 |
|   | 14 | 0 | 0 | 0 | 0 | 0 | 0 | 0 | 0 |
| 5 | 0 | 231 | 10 | 0 | 185 | 40 | 79 | 136 | 121 |
|   | 1 | 41 | 44 | 131 | 138 | 140 | 84 | 49 | 41 |
|   | 5 | 194 | 121 | 142 | 170 | 84 | 35 | 36 | 169 |
|   | 7 | 159 | 80 | 141 | 219 | 137 | 103 | 132 | 88 |
|   | 11 | 103 | 43 | 64 | 193 | 71 | 60 | 62 | 207 |
|   | 15 | 0 | 0 | 0 | 0 | 0 | 0 | 0 | 0 |
| 6 | 0 | 155 | 129 | 0 | 123 | 109 | 47 | 7 | 137 |
|   | 5 | 228 | 92 | 124 | 55 | 87 | 154 | 34 | 72 |
|   | 7 | 45 | 100 | 99 | 31 | 107 | 10 | 198 | 172 |
|   | 9 | 28 | 49 | 45 | 222 | 133 | 155 | 168 | 124 |
|   | 11 | 158 | 184 | 148 | 209 | 139 | 29 | 12 | 56 |
|   | 16 | 0 | 0 | 0 | 0 | 0 | 0 | 0 | 0 |
| 7 | 1 | 129 | 80 | 0 | 103 | 97 | 48 | 163 | 86 |
|   | 5 | 147 | 186 | 45 | 13 | 135 | 125 | 78 | 186 |
|   | 7 | 140 | 16 | 148 | 105 | 35 | 24 | 143 | 87 |
|   | 11 | 3 | 102 | 96 | 150 | 108 | 47 | 107 | 172 |
|   | 13 | 116 | 143 | 78 | 181 | 65 | 55 | 58 | 154 |
|   | 17 | 0 | 0 | 0 | 0 | 0 | 0 | 0 | 0 |
| 8 | 0 | 142 | 118 | 0 | 147 | 70 | 53 | 101 | 176 |
|   | 1 | 94 | 70 | 65 | 43 | 69 | 31 | 177 | 169 |
|   | 12 | 230 | 152 | 87 | 152 | 88 | 161 | 22 | 225 |
|   | 18 | 0 | 0 | 0 | 0 | 0 | 0 | 0 | 0 |
| 9 | 1 | 203 | 28 | 0 | 2 | 97 | 104 | 186 | 167 |
|   | 8 | 205 | 132 | 97 | 30 | 40 | 142 | 27 | 238 |
|   | 10 | 61 | 185 | 51 | 184 | 24 | 99 | 205 | 48 |

-continued

| i | j | 1 | 2 | 3 | 4 | 5 | 6 | 7 | 8 |
|---|---|---|---|---|---|---|---|---|---|
|  | 11 | 247 | 178 | 85 | 83 | 49 | 64 | 81 | 68 |
|  | 19 | 0 | 0 | 0 | 0 | 0 | 0 | 0 | 0 |
| 10 | 0 | 11 | 59 | 0 | 174 | 46 | 111 | 125 | 38 |
|  | 1 | 185 | 104 | 17 | 150 | 41 | 25 | 60 | 217 |
|  | 6 | 0 | 22 | 156 | 8 | 101 | 174 | 177 | 208 |
|  | 7 | 117 | 52 | 20 | 56 | 96 | 23 | 51 | 232 |
|  | 20 | 0 | 0 | 0 | 0 | 0 | 0 | 0 | 0 |
| 11 | 0 | 11 | 32 | 0 | 99 | 28 | 91 | 39 | 178 |
|  | 7 | 236 | 92 | 7 | 138 | 30 | 175 | 29 | 214 |
|  | 9 | 210 | 174 | 4 | 110 | 116 | 24 | 35 | 168 |
|  | 13 | 56 | 154 | 2 | 99 | 64 | 141 | 8 | 51 |
|  | 21 | 0 | 0 | 0 | 0 | 0 | 0 | 0 | 0 |
| 12 | 1 | 63 | 39 | 0 | 46 | 33 | 122 | 18 | 124 |
|  | 3 | 111 | 93 | 113 | 217 | 122 | 11 | 155 | 122 |
|  | 11 | 14 | 11 | 48 | 109 | 131 | 4 | 49 | 72 |
|  | 22 | 0 | 0 | 0 | 0 | 0 | 0 | 0 | 0 |
| 13 | 0 | 83 | 49 | 0 | 37 | 76 | 29 | 32 | 48 |
|  | 1 | 2 | 125 | 112 | 113 | 37 | 91 | 53 | 57 |
|  | 8 | 38 | 35 | 102 | 143 | 62 | 27 | 95 | 167 |
|  | 13 | 222 | 166 | 26 | 140 | 47 | 127 | 186 | 219 |
|  | 23 | 0 | 0 | 0 | 0 | 0 | 0 | 0 | 0 |
| 14 | 1 | 115 | 19 | 0 | 36 | 143 | 11 | 91 | 82 |
|  | 6 | 145 | 118 | 138 | 95 | 51 | 145 | 20 | 232 |
|  | 11 | 3 | 21 | 57 | 40 | 130 | 8 | 52 | 204 |
|  | 13 | 232 | 163 | 27 | 116 | 97 | 166 | 109 | 162 |
|  | 24 | 0 | 0 | 0 | 0 | 0 | 0 | 0 | 0 |
| 15 | 0 | 51 | 68 | 0 | 116 | 139 | 137 | 174 | 38 |
|  | 10 | 175 | 63 | 73 | 200 | 96 | 103 | 108 | 217 |
|  | 11 | 213 | 81 | 99 | 110 | 128 | 40 | 102 | 157 |
|  | 25 | 0 | 0 | 0 | 0 | 0 | 0 | 0 | 0 |
| 16 | 1 | 203 | 87 | 0 | 75 | 48 | 78 | 125 | 170 |
|  | 9 | 142 | 177 | 79 | 158 | 9 | 158 | 31 | 23 |
|  | 11 | 8 | 135 | 111 | 134 | 28 | 17 | 54 | 175 |
|  | 12 | 242 | 64 | 143 | 97 | 8 | 165 | 176 | 202 |
|  | 26 | 0 | 0 | 0 | 0 | 0 | 0 | 0 | 0 |
| 17 | 1 | 254 | 158 | 0 | 48 | 120 | 134 | 57 | 196 |
|  | 5 | 124 | 23 | 24 | 132 | 43 | 23 | 201 | 173 |
|  | 11 | 114 | 9 | 109 | 206 | 65 | 62 | 142 | 195 |
|  | 12 | 64 | 6 | 18 | 2 | 42 | 163 | 35 | 218 |
|  | 27 | 0 | 0 | 0 | 0 | 0 | 0 | 0 | 0 |
| 18 | 0 | 220 | 186 | 0 | 68 | 17 | 173 | 129 | 128 |
|  | 6 | 194 | 6 | 18 | 16 | 106 | 31 | 203 | 211 |
|  | 7 | 50 | 46 | 86 | 156 | 142 | 22 | 140 | 210 |
|  | 28 | 0 | 0 | 0 | 0 | 0 | 0 | 0 | 0 |
| 19 | 0 | 87 | 58 | 0 | 35 | 79 | 13 | 110 | 39 |
|  | 1 | 20 | 42 | 158 | 138 | 28 | 135 | 124 | 84 |
|  | 10 | 185 | 156 | 154 | 86 | 41 | 145 | 52 | 88 |
|  | 29 | 0 | 0 | 0 | 0 | 0 | 0 | 0 | 0 |
| 20 | 1 | 26 | 76 | 0 | 6 | 2 | 128 | 196 | 117 |
|  | 4 | 105 | 61 | 148 | 20 | 103 | 52 | 35 | 227 |
|  | 11 | 29 | 153 | 104 | 141 | 78 | 173 | 114 | 6 |
|  | 30 | 0 | 0 | 0 | 0 | 0 | 0 | 0 | 0 |
| 21 | 0 | 76 | 157 | 0 | 80 | 91 | 156 | 10 | 238 |
|  | 8 | 42 | 175 | 17 | 43 | 75 | 166 | 122 | 13 |
|  | 13 | 210 | 67 | 33 | 81 | 81 | 40 | 23 | 11 |
|  | 31 | 0 | 0 | 0 | 0 | 0 | 0 | 0 | 0 |
| 22 | 1 | 222 | 20 | 0 | 49 | 54 | 18 | 202 | 195 |
|  | 2 | 63 | 52 | 4 | 1 | 132 | 163 | 126 | 44 |
|  | 32 | 0 | 0 | 0 | 0 | 0 | 0 | 0 | 0 |
| 23 | 0 | 23 | 106 | 0 | 156 | 68 | 110 | 52 | 5 |
|  | 3 | 235 | 86 | 75 | 54 | 115 | 132 | 170 | 94 |
|  | 5 | 238 | 95 | 158 | 134 | 56 | 150 | 13 | 111 |
|  | 33 | 0 | 0 | 0 | 0 | 0 | 0 | 0 | 0 |
| 24 | 1 | 46 | 182 | 0 | 153 | 30 | 113 | 113 | 81 |
|  | 2 | 139 | 153 | 69 | 88 | 42 | 108 | 161 | 19 |
|  | 9 | 8 | 64 | 87 | 63 | 101 | 61 | 88 | 130 |
|  | 34 | 0 | 0 | 0 | 0 | 0 | 0 | 0 | 0 |
| 25 | 0 | 228 | 45 | 0 | 211 | 128 | 72 | 197 | 66 |
|  | 5 | 156 | 21 | 65 | 94 | 63 | 136 | 194 | 95 |
|  | 35 | 0 | 0 | 0 | 0 | 0 | 0 | 0 | 0 |
| 26 | 2 | 29 | 67 | 0 | 90 | 142 | 36 | 164 | 146 |
|  | 7 | 143 | 137 | 100 | 6 | 28 | 38 | 172 | 66 |
|  | 12 | 160 | 55 | 13 | 221 | 100 | 53 | 49 | 190 |
|  | 13 | 122 | 85 | 7 | 6 | 133 | 145 | 161 | 86 |
|  | 36 | 0 | 0 | 0 | 0 | 0 | 0 | 0 | 0 |
| 27 | 0 | 8 | 103 | 0 | 27 | 13 | 42 | 168 | 64 |
|  | 6 | 151 | 50 | 32 | 118 | 10 | 104 | 193 | 181 |
|  | 37 | 0 | 0 | 0 | 0 | 0 | 0 | 0 | 0 |
| 28 | 1 | 98 | 70 | 0 | 216 | 106 | 64 | 14 | 7 |
|  | 2 | 101 | 111 | 126 | 212 | 77 | 24 | 186 | 144 |
|  | 5 | 135 | 168 | 110 | 193 | 43 | 149 | 46 | 16 |
|  | 38 | 0 | 0 | 0 | 0 | 0 | 0 | 0 | 0 |
| 29 | 0 | 18 | 110 | 0 | 108 | 133 | 139 | 50 | 25 |
|  | 4 | 28 | 17 | 154 | 61 | 25 | 161 | 27 | 57 |
|  | 39 | 0 | 0 | 0 | 0 | 0 | 0 | 0 | 0 |
| 30 | 2 | 71 | 120 | 0 | 106 | 87 | 84 | 70 | 37 |
|  | 5 | 240 | 154 | 35 | 44 | 56 | 173 | 17 | 139 |
|  | 7 | 9 | 52 | 51 | 185 | 104 | 93 | 50 | 221 |
|  | 9 | 84 | 56 | 134 | 176 | 70 | 29 | 6 | 17 |
|  | 40 | 0 | 0 | 0 | 0 | 0 | 0 | 0 | 0 |
| 31 | 1 | 106 | 3 | 0 | 147 | 80 | 117 | 115 | 201 |
|  | 13 | 1 | 170 | 20 | 182 | 139 | 148 | 189 | 46 |
|  | 41 | 0 | 0 | 0 | 0 | 0 | 0 | 0 | 0 |
| 32 | 0 | 242 | 84 | 0 | 108 | 32 | 116 | 110 | 179 |
|  | 5 | 44 | 8 | 20 | 21 | 89 | 73 | 0 | 14 |
|  | 12 | 166 | 17 | 122 | 110 | 71 | 142 | 163 | 116 |
|  | 42 | 0 | 0 | 0 | 0 | 0 | 0 | 0 | 0 |
| 33 | 2 | 132 | 165 | 0 | 71 | 135 | 105 | 163 | 46 |
|  | 7 | 164 | 179 | 88 | 12 | 6 | 137 | 173 | 2 |
|  | 10 | 235 | 124 | 13 | 109 | 2 | 29 | 179 | 106 |
|  | 43 | 0 | 0 | 0 | 0 | 0 | 0 | 0 | 0 |
| 34 | 0 | 147 | 173 | 0 | 29 | 37 | 11 | 197 | 184 |
|  | 12 | 85 | 177 | 19 | 201 | 25 | 41 | 191 | 135 |
|  | 13 | 36 | 12 | 78 | 69 | 114 | 162 | 193 | 141 |
|  | 44 | 0 | 0 | 0 | 0 | 0 | 0 | 0 | 0 |
| 35 | 1 | 57 | 77 | 0 | 91 | 60 | 126 | 157 | 85 |
|  | 5 | 40 | 184 | 157 | 165 | 137 | 152 | 167 | 225 |
|  | 11 | 63 | 18 | 6 | 55 | 93 | 172 | 181 | 175 |
|  | 45 | 0 | 0 | 0 | 0 | 0 | 0 | 0 | 0 |
| 36 | 0 | 140 | 25 | 0 | 1 | 121 | 73 | 197 | 178 |
|  | 2 | 38 | 151 | 63 | 175 | 129 | 154 | 167 | 112 |
|  | 7 | 154 | 170 | 82 | 83 | 26 | 129 | 170 | 106 |
|  | 46 | 0 | 0 | 0 | 0 | 0 | 0 | 0 | 0 |
| 37 | 10 | 219 | 37 | 0 | 40 | 97 | 167 | 181 | 154 |
|  | 13 | 151 | 31 | 144 | 12 | 56 | 38 | 193 | 114 |
|  | 47 | 0 | 0 | 0 | 0 | 0 | 0 | 0 | 0 |
| 38 | 1 | 31 | 84 | 0 | 37 | 1 | 112 | 157 | 42 |
|  | 5 | 66 | 151 | 93 | 97 | 70 | 7 | 173 | 41 |
|  | 11 | 38 | 190 | 19 | 46 | 1 | 19 | 191 | 105 |
|  | 48 | 0 | 0 | 0 | 0 | 0 | 0 | 0 | 0 |
| 39 | 0 | 239 | 93 | 0 | 106 | 119 | 109 | 181 | 167 |
|  | 7 | 172 | 132 | 24 | 181 | 32 | 6 | 157 | 45 |
|  | 12 | 34 | 57 | 138 | 154 | 142 | 105 | 173 | 189 |
|  | 49 | 0 | 0 | 0 | 0 | 0 | 0 | 0 | 0 |
| 40 | 2 | 0 | 103 | 0 | 98 | 6 | 160 | 193 | 78 |
|  | 10 | 75 | 107 | 36 | 35 | 73 | 156 | 163 | 67 |
|  | 13 | 120 | 163 | 143 | 36 | 102 | 82 | 179 | 180 |
|  | 50 | 0 | 0 | 0 | 0 | 0 | 0 | 0 | 0 |
| 41 | 1 | 129 | 147 | 0 | 120 | 48 | 132 | 191 | 53 |
|  | 5 | 229 | 7 | 2 | 101 | 47 | 6 | 197 | 215 |
|  | 11 | 118 | 60 | 55 | 81 | 19 | 8 | 167 | 230 |
|  | 51 | 0 | 0 | 0 | 0 | 0 | 0 | 0 | 0 |

The following table uses the BG 1 as an example to illustrate a possible value of

| i | j | 1 | 2 | 3 | 4 | 5 | 6 | 7 | 8 |
|---|---|---|---|---|---|---|---|---|---|
| 0 | 0 | 250 | 307 | 73 | 223 | 211 | 294 | 0 | 135 |
|  | 1 | 69 | 19 | 15 | 16 | 198 | 118 | 0 | 227 |
|  | 2 | 226 | 50 | 103 | 94 | 188 | 167 | 0 | 126 |
|  | 3 | 159 | 369 | 49 | 91 | 186 | 330 | 0 | 134 |
|  | 5 | 100 | 181 | 240 | 74 | 219 | 207 | 0 | 84 |
|  | 6 | 10 | 216 | 39 | 10 | 4 | 165 | 0 | 83 |
|  | 9 | 59 | 317 | 15 | 0 | 29 | 243 | 0 | 53 |
|  | 10 | 229 | 288 | 162 | 205 | 144 | 250 | 0 | 225 |

| i | j | 1 | 2 | 3 | 4 | 5 | 6 | 7 | 8 |
|---|---|---|---|---|---|---|---|---|---|
|   | 11 | 110 | 109 | 215 | 216 | 116 | 1 | 0 | 205 |
|   | 12 | 191 | 17 | 164 | 21 | 216 | 339 | 0 | 128 |
|   | 13 | 9 | 357 | 133 | 215 | 115 | 201 | 0 | 75 |
|   | 15 | 195 | 215 | 298 | 14 | 233 | 53 | 0 | 135 |
|   | 16 | 23 | 106 | 110 | 70 | 144 | 347 | 0 | 217 |
|   | 18 | 190 | 242 | 113 | 141 | 95 | 304 | 0 | 220 |
|   | 19 | 35 | 180 | 16 | 198 | 216 | 167 | 0 | 90 |
|   | 20 | 239 | 330 | 189 | 104 | 73 | 47 | 0 | 105 |
|   | 21 | 31 | 346 | 32 | 81 | 261 | 188 | 0 | 137 |
|   | 22 | 1 | 1 | 1 | 1 | 1 | 1 | 0 | 1 |
|   | 23 | 0 | 0 | 0 | 0 | 0 | 0 | 0 | 0 |
| 1 | 0 | 2 | 76 | 303 | 141 | 179 | 77 | 22 | 96 |
|   | 2 | 239 | 76 | 294 | 45 | 162 | 225 | 11 | 236 |
|   | 3 | 117 | 73 | 27 | 151 | 223 | 96 | 124 | 136 |
|   | 4 | 124 | 288 | 261 | 46 | 256 | 338 | 0 | 221 |
|   | 5 | 71 | 144 | 161 | 119 | 160 | 268 | 10 | 128 |
|   | 7 | 222 | 331 | 133 | 157 | 76 | 112 | 0 | 92 |
|   | 8 | 104 | 331 | 4 | 133 | 202 | 302 | 0 | 172 |
|   | 9 | 173 | 178 | 80 | 87 | 117 | 50 | 2 | 56 |
|   | 11 | 220 | 295 | 129 | 206 | 109 | 167 | 16 | 11 |
|   | 12 | 102 | 342 | 300 | 93 | 15 | 253 | 60 | 189 |
|   | 14 | 109 | 217 | 76 | 79 | 72 | 334 | 0 | 95 |
|   | 15 | 132 | 99 | 266 | 9 | 152 | 242 | 6 | 85 |
|   | 16 | 142 | 354 | 72 | 118 | 158 | 257 | 30 | 153 |
|   | 17 | 155 | 114 | 83 | 194 | 147 | 133 | 0 | 87 |
|   | 19 | 255 | 331 | 260 | 31 | 156 | 9 | 168 | 163 |
|   | 21 | 28 | 112 | 301 | 187 | 119 | 302 | 31 | 216 |
|   | 22 | 0 | 0 | 0 | 0 | 0 | 0 | 150 | 0 |
|   | 23 | 0 | 0 | 0 | 0 | 0 | 0 | 0 | 0 |
|   | 24 | 0 | 0 | 0 | 0 | 0 | 0 | 0 | 0 |
| 2 | 0 | 106 | 205 | 68 | 207 | 258 | 226 | 132 | 189 |
|   | 1 | 111 | 250 | 7 | 203 | 167 | 35 | 37 | 4 |
|   | 2 | 185 | 328 | 80 | 31 | 220 | 213 | 21 | 225 |
|   | 4 | 63 | 332 | 280 | 176 | 133 | 302 | 180 | 151 |
|   | 5 | 117 | 256 | 38 | 180 | 243 | 111 | 4 | 236 |
|   | 6 | 93 | 161 | 227 | 186 | 202 | 265 | 149 | 117 |
|   | 7 | 229 | 267 | 202 | 95 | 218 | 128 | 48 | 179 |
|   | 8 | 177 | 160 | 200 | 153 | 63 | 237 | 38 | 92 |
|   | 9 | 95 | 63 | 71 | 177 | 0 | 294 | 122 | 24 |
|   | 10 | 39 | 129 | 106 | 70 | 3 | 127 | 195 | 68 |
|   | 13 | 142 | 200 | 295 | 77 | 74 | 110 | 155 | 6 |
|   | 14 | 225 | 88 | 283 | 214 | 229 | 286 | 28 | 101 |
|   | 15 | 225 | 53 | 301 | 77 | 0 | 125 | 85 | 33 |
|   | 17 | 245 | 131 | 184 | 198 | 216 | 131 | 47 | 96 |
|   | 18 | 205 | 240 | 246 | 117 | 269 | 163 | 179 | 125 |
|   | 19 | 251 | 205 | 230 | 223 | 200 | 210 | 42 | 67 |
|   | 20 | 117 | 13 | 276 | 90 | 234 | 7 | 66 | 230 |
|   | 24 | 0 | 0 | 0 | 0 | 0 | 0 | 0 | 0 |
|   | 25 | 0 | 0 | 0 | 0 | 0 | 0 | 0 | 0 |
| 3 | 0 | 121 | 276 | 220 | 201 | 187 | 97 | 4 | 128 |
|   | 1 | 89 | 87 | 208 | 18 | 145 | 94 | 6 | 23 |
|   | 3 | 84 | 0 | 30 | 165 | 166 | 49 | 33 | 162 |
|   | 4 | 20 | 275 | 197 | 5 | 108 | 279 | 113 | 220 |
|   | 6 | 150 | 199 | 61 | 45 | 82 | 139 | 49 | 43 |
|   | 7 | 131 | 153 | 175 | 142 | 132 | 166 | 21 | 186 |
|   | 8 | 243 | 56 | 79 | 16 | 197 | 91 | 6 | 96 |
|   | 10 | 136 | 132 | 281 | 34 | 41 | 106 | 151 | 1 |
|   | 11 | 86 | 305 | 303 | 155 | 162 | 246 | 83 | 216 |
|   | 12 | 246 | 231 | 253 | 213 | 57 | 345 | 154 | 22 |
|   | 13 | 219 | 341 | 164 | 147 | 36 | 269 | 87 | 24 |
|   | 14 | 211 | 212 | 53 | 69 | 115 | 185 | 5 | 167 |
|   | 16 | 240 | 304 | 44 | 96 | 242 | 249 | 92 | 200 |
|   | 17 | 76 | 300 | 28 | 74 | 165 | 215 | 173 | 32 |
|   | 18 | 244 | 271 | 77 | 99 | 0 | 143 | 120 | 235 |
|   | 20 | 144 | 39 | 319 | 30 | 113 | 121 | 2 | 172 |
|   | 21 | 12 | 357 | 68 | 158 | 108 | 121 | 142 | 219 |
|   | 22 | 1 | 1 | 1 | 1 | 1 | 1 | 1 | 1 |
|   | 25 | 0 | 0 | 0 | 0 | 0 | 0 | 0 | 0 |
| 4 | 0 | 157 | 332 | 233 | 170 | 246 | 42 | 24 | 64 |
|   | 1 | 102 | 181 | 205 | 10 | 235 | 256 | 204 | 211 |
|   | 26 | 0 | 0 | 0 | 0 | 0 | 0 | 0 | 0 |
| 5 | 0 | 205 | 195 | 83 | 164 | 261 | 219 | 185 | 2 |
|   | 1 | 236 | 14 | 292 | 59 | 181 | 130 | 100 | 171 |
|   | 3 | 194 | 115 | 50 | 86 | 72 | 251 | 24 | 47 |
|   | 12 | 231 | 166 | 318 | 80 | 283 | 322 | 65 | 143 |
|   | 16 | 28 | 241 | 201 | 182 | 254 | 295 | 207 | 210 |
|   | 21 | 123 | 51 | 267 | 130 | 79 | 258 | 161 | 180 |
|   | 22 | 115 | 157 | 279 | 153 | 144 | 283 | 72 | 180 |
|   | 27 | 0 | 0 | 0 | 0 | 0 | 0 | 0 | 0 |
| 6 | 0 | 183 | 278 | 289 | 158 | 80 | 294 | 6 | 199 |
|   | 6 | 22 | 257 | 21 | 119 | 144 | 73 | 27 | 22 |
|   | 10 | 28 | 1 | 293 | 113 | 169 | 330 | 163 | 23 |
|   | 11 | 67 | 351 | 13 | 21 | 90 | 99 | 50 | 100 |
|   | 13 | 244 | 92 | 232 | 63 | 59 | 172 | 48 | 92 |
|   | 17 | 11 | 253 | 302 | 51 | 177 | 150 | 24 | 207 |
|   | 18 | 157 | 18 | 138 | 136 | 151 | 284 | 38 | 52 |
|   | 20 | 211 | 225 | 235 | 116 | 108 | 305 | 91 | 13 |
|   | 28 | 0 | 0 | 0 | 0 | 0 | 0 | 0 | 0 |
| 7 | 0 | 220 | 9 | 12 | 17 | 169 | 3 | 145 | 77 |
|   | 1 | 44 | 62 | 88 | 76 | 189 | 103 | 88 | 146 |
|   | 4 | 159 | 316 | 207 | 104 | 154 | 224 | 112 | 209 |
|   | 7 | 31 | 333 | 50 | 100 | 184 | 297 | 153 | 32 |
|   | 8 | 167 | 290 | 25 | 150 | 104 | 215 | 159 | 166 |
|   | 14 | 104 | 114 | 76 | 158 | 164 | 39 | 76 | 18 |
|   | 29 | 0 | 0 | 0 | 0 | 0 | 0 | 0 | 0 |
| 8 | 0 | 112 | 307 | 295 | 33 | 54 | 348 | 172 | 181 |
|   | 1 | 4 | 179 | 133 | 95 | 0 | 75 | 2 | 105 |
|   | 3 | 7 | 165 | 130 | 4 | 252 | 22 | 131 | 141 |
|   | 12 | 211 | 18 | 231 | 217 | 41 | 312 | 141 | 223 |
|   | 16 | 102 | 39 | 296 | 204 | 98 | 224 | 96 | 177 |
|   | 19 | 164 | 224 | 110 | 39 | 46 | 17 | 99 | 145 |
|   | 21 | 109 | 368 | 269 | 58 | 15 | 59 | 101 | 199 |
|   | 22 | 241 | 67 | 245 | 44 | 230 | 314 | 35 | 153 |
|   | 24 | 90 | 170 | 154 | 201 | 54 | 244 | 116 | 38 |
|   | 30 | 0 | 0 | 0 | 0 | 0 | 0 | 0 | 0 |
| 9 | 0 | 103 | 366 | 189 | 9 | 162 | 156 | 6 | 169 |
|   | 1 | 182 | 232 | 244 | 37 | 159 | 88 | 10 | 12 |
|   | 10 | 109 | 321 | 36 | 213 | 93 | 293 | 145 | 206 |
|   | 11 | 21 | 133 | 286 | 105 | 134 | 111 | 53 | 221 |
|   | 13 | 142 | 57 | 151 | 89 | 45 | 92 | 201 | 17 |
|   | 17 | 14 | 303 | 267 | 185 | 132 | 152 | 4 | 212 |
|   | 18 | 61 | 63 | 135 | 109 | 76 | 23 | 164 | 92 |
|   | 20 | 216 | 82 | 209 | 218 | 209 | 337 | 173 | 205 |
|   | 31 | 0 | 0 | 0 | 0 | 0 | 0 | 0 | 0 |
| 10 | 1 | 98 | 101 | 14 | 82 | 178 | 175 | 126 | 116 |
|   | 2 | 149 | 339 | 80 | 165 | 1 | 253 | 77 | 151 |
|   | 4 | 167 | 274 | 211 | 174 | 28 | 27 | 156 | 70 |
|   | 7 | 160 | 111 | 75 | 19 | 267 | 231 | 16 | 230 |
|   | 8 | 49 | 383 | 161 | 194 | 234 | 49 | 12 | 115 |
|   | 14 | 58 | 354 | 311 | 103 | 201 | 267 | 70 | 84 |
|   | 32 | 0 | 0 | 0 | 0 | 0 | 0 | 0 | 0 |
| 11 | 0 | 77 | 48 | 16 | 52 | 55 | 25 | 184 | 45 |
|   | 1 | 41 | 102 | 147 | 11 | 23 | 322 | 194 | 115 |
|   | 12 | 83 | 8 | 290 | 2 | 274 | 200 | 123 | 134 |
|   | 16 | 182 | 47 | 289 | 35 | 181 | 351 | 16 | 1 |
|   | 21 | 78 | 188 | 177 | 32 | 273 | 166 | 104 | 152 |
|   | 22 | 252 | 334 | 43 | 84 | 39 | 338 | 109 | 165 |
|   | 23 | 22 | 115 | 280 | 201 | 26 | 192 | 124 | 107 |
|   | 33 | 0 | 0 | 0 | 0 | 0 | 0 | 0 | 0 |
| 12 | 0 | 160 | 77 | 229 | 142 | 225 | 123 | 6 | 186 |
|   | 1 | 42 | 186 | 235 | 175 | 162 | 217 | 20 | 215 |
|   | 10 | 21 | 174 | 169 | 136 | 244 | 142 | 203 | 124 |
|   | 11 | 32 | 232 | 48 | 3 | 151 | 110 | 153 | 180 |
|   | 13 | 235 | 50 | 105 | 28 | 238 | 176 | 104 | 98 |
|   | 18 | 7 | 74 | 52 | 182 | 243 | 76 | 207 | 80 |
|   | 34 | 0 | 0 | 0 | 0 | 0 | 0 | 0 | 0 |
| 13 | 0 | 177 | 313 | 39 | 81 | 231 | 311 | 52 | 220 |
|   | 3 | 248 | 177 | 302 | 56 | 0 | 251 | 147 | 185 |
|   | 7 | 151 | 266 | 303 | 72 | 216 | 265 | 1 | 154 |
|   | 20 | 185 | 115 | 160 | 217 | 47 | 94 | 16 | 178 |
|   | 23 | 62 | 370 | 37 | 78 | 36 | 81 | 46 | 150 |
|   | 35 | 0 | 0 | 0 | 0 | 0 | 0 | 0 | 0 |
| 14 | 0 | 206 | 142 | 78 | 14 | 0 | 22 | 1 | 124 |
|   | 12 | 55 | 248 | 299 | 175 | 186 | 322 | 202 | 144 |
|   | 15 | 206 | 137 | 54 | 211 | 253 | 277 | 118 | 182 |
|   | 16 | 127 | 89 | 61 | 191 | 16 | 156 | 130 | 95 |
|   | 17 | 16 | 347 | 179 | 51 | 0 | 66 | 1 | 72 |
|   | 21 | 229 | 12 | 258 | 43 | 79 | 78 | 2 | 76 |
|   | 36 | 0 | 0 | 0 | 0 | 0 | 0 | 0 | 0 |

| i | j | \multicolumn{8}{c}{$i_{LS}$} |
| | | 1 | 2 | 3 | 4 | 5 | 6 | 7 | 8 |
|---|---|---|---|---|---|---|---|---|---|
| 15 | 0 | 40 | 241 | 229 | 90 | 170 | 176 | 173 | 39 |
|  | 1 | 96 | 2 | 290 | 120 | 0 | 348 | 6 | 138 |
|  | 10 | 65 | 210 | 60 | 131 | 183 | 15 | 81 | 220 |
|  | 13 | 63 | 318 | 130 | 209 | 108 | 81 | 182 | 173 |
|  | 18 | 75 | 55 | 184 | 209 | 68 | 176 | 53 | 142 |
|  | 25 | 179 | 269 | 51 | 81 | 64 | 113 | 46 | 49 |
|  | 37 | 0 | 0 | 0 | 0 | 0 | 0 | 0 | 0 |
| 16 | 1 | 64 | 13 | 69 | 154 | 270 | 190 | 88 | 78 |
|  | 3 | 49 | 338 | 140 | 164 | 13 | 293 | 198 | 152 |
|  | 11 | 49 | 57 | 45 | 43 | 99 | 332 | 160 | 84 |
|  | 20 | 51 | 289 | 115 | 189 | 54 | 331 | 122 | 5 |
|  | 22 | 154 | 57 | 300 | 101 | 0 | 114 | 182 | 205 |
|  | 38 | 0 | 0 | 0 | 0 | 0 | 0 | 0 | 0 |
| 17 | 0 | 7 | 260 | 257 | 56 | 153 | 110 | 91 | 183 |
|  | 14 | 164 | 303 | 147 | 110 | 137 | 228 | 184 | 112 |
|  | 16 | 59 | 81 | 128 | 200 | 0 | 247 | 30 | 106 |
|  | 17 | 1 | 358 | 51 | 63 | 0 | 116 | 3 | 219 |
|  | 21 | 144 | 375 | 228 | 4 | 162 | 190 | 155 | 129 |
|  | 39 | 0 | 0 | 0 | 0 | 0 | 0 | 0 | 0 |
| 18 | 1 | 42 | 130 | 260 | 199 | 161 | 47 | 1 | 183 |
|  | 12 | 233 | 163 | 294 | 110 | 151 | 286 | 41 | 215 |
|  | 13 | 8 | 280 | 291 | 200 | 0 | 246 | 167 | 180 |
|  | 18 | 155 | 132 | 141 | 143 | 241 | 181 | 68 | 143 |
|  | 19 | 147 | 4 | 295 | 186 | 144 | 73 | 148 | 14 |
|  | 40 | 0 | 0 | 0 | 0 | 0 | 0 | 0 | 0 |
| 19 | 0 | 60 | 145 | 64 | 8 | 0 | 87 | 12 | 179 |
|  | 1 | 73 | 213 | 181 | 6 | 0 | 110 | 6 | 108 |
|  | 7 | 72 | 344 | 101 | 103 | 118 | 147 | 166 | 159 |
|  | 8 | 127 | 242 | 270 | 198 | 144 | 258 | 184 | 138 |
|  | 10 | 224 | 197 | 41 | 8 | 0 | 204 | 191 | 196 |
|  | 41 | 0 | 0 | 0 | 0 | 0 | 0 | 0 | 0 |
| 20 | 0 | 151 | 187 | 301 | 105 | 265 | 89 | 6 | 77 |
|  | 3 | 186 | 206 | 162 | 210 | 81 | 65 | 12 | 187 |
|  | 9 | 217 | 264 | 40 | 121 | 90 | 155 | 15 | 203 |
|  | 11 | 47 | 341 | 130 | 214 | 144 | 244 | 5 | 167 |
|  | 22 | 160 | 59 | 10 | 183 | 228 | 30 | 30 | 130 |
|  | 42 | 0 | 0 | 0 | 0 | 0 | 0 | 0 | 0 |
| 21 | 1 | 249 | 205 | 79 | 192 | 64 | 162 | 6 | 197 |
|  | 5 | 121 | 102 | 175 | 131 | 46 | 264 | 86 | 122 |
|  | 16 | 109 | 328 | 132 | 220 | 266 | 346 | 96 | 215 |
|  | 20 | 131 | 213 | 283 | 50 | 9 | 143 | 42 | 65 |
|  | 21 | 171 | 97 | 103 | 106 | 18 | 109 | 199 | 216 |
|  | 43 | 0 | 0 | 0 | 0 | 0 | 0 | 0 | 0 |
| 22 | 0 | 64 | 30 | 177 | 53 | 72 | 280 | 44 | 25 |
|  | 12 | 142 | 11 | 20 | 0 | 189 | 157 | 58 | 47 |
|  | 13 | 188 | 233 | 55 | 3 | 72 | 236 | 130 | 126 |
|  | 17 | 158 | 22 | 316 | 148 | 257 | 113 | 131 | 178 |
|  | 44 | 0 | 0 | 0 | 0 | 0 | 0 | 0 | 0 |
| 23 | 1 | 156 | 24 | 249 | 88 | 180 | 18 | 45 | 185 |
|  | 2 | 147 | 89 | 50 | 203 | 0 | 6 | 18 | 127 |
|  | 10 | 170 | 61 | 133 | 168 | 0 | 181 | 132 | 117 |
|  | 18 | 152 | 27 | 105 | 122 | 165 | 304 | 100 | 199 |
|  | 45 | 0 | 0 | 0 | 0 | 0 | 0 | 0 | 0 |
| 24 | 0 | 112 | 298 | 289 | 49 | 236 | 38 | 9 | 32 |
|  | 3 | 86 | 158 | 280 | 157 | 199 | 170 | 125 | 178 |
|  | 4 | 236 | 235 | 110 | 64 | 0 | 249 | 191 | 2 |
|  | 11 | 116 | 339 | 187 | 193 | 266 | 288 | 28 | 156 |
|  | 22 | 222 | 234 | 281 | 124 | 0 | 194 | 6 | 58 |
|  | 46 | 0 | 0 | 0 | 0 | 0 | 0 | 0 | 0 |
| 25 | 1 | 23 | 72 | 172 | 1 | 205 | 279 | 4 | 27 |
|  | 6 | 136 | 17 | 295 | 166 | 0 | 255 | 74 | 141 |
|  | 7 | 116 | 383 | 96 | 65 | 0 | 111 | 16 | 11 |
|  | 14 | 182 | 312 | 46 | 81 | 183 | 54 | 28 | 181 |
|  | 47 | 0 | 0 | 0 | 0 | 0 | 0 | 0 | 0 |
| 26 | 0 | 195 | 71 | 270 | 107 | 0 | 235 | 21 | 163 |
|  | 2 | 243 | 81 | 110 | 176 | 0 | 326 | 142 | 131 |
|  | 4 | 215 | 76 | 318 | 212 | 0 | 226 | 192 | 169 |
|  | 15 | 61 | 136 | 67 | 127 | 277 | 99 | 197 | 98 |
|  | 48 | 0 | 0 | 0 | 0 | 0 | 0 | 0 | 0 |
| 27 | 1 | 25 | 194 | 210 | 208 | 45 | 91 | 98 | 165 |
|  | 6 | 104 | 194 | 29 | 141 | 36 | 326 | 140 | 232 |
|  | 8 | 194 | 101 | 304 | 174 | 72 | 268 | 22 | 9 |
|  | 49 | 0 | 0 | 0 | 0 | 0 | 0 | 0 | 0 |
| 28 | 0 | 128 | 222 | 11 | 146 | 275 | 102 | 4 | 32 |
|  | 4 | 165 | 19 | 293 | 153 | 0 | 1 | 1 | 43 |
|  | 19 | 181 | 244 | 50 | 217 | 155 | 40 | 40 | 200 |
|  | 21 | 63 | 274 | 234 | 114 | 62 | 167 | 93 | 205 |
|  | 50 | 0 | 0 | 0 | 0 | 0 | 0 | 0 | 0 |
| 29 | 1 | 86 | 252 | 27 | 150 | 0 | 273 | 92 | 232 |
|  | 14 | 236 | 5 | 308 | 11 | 180 | 104 | 136 | 32 |
|  | 18 | 84 | 147 | 117 | 53 | 0 | 243 | 106 | 118 |
|  | 25 | 6 | 78 | 29 | 68 | 42 | 107 | 6 | 103 |
|  | 51 | 0 | 0 | 0 | 0 | 0 | 0 | 0 | 0 |
| 30 | 0 | 216 | 159 | 91 | 34 | 0 | 171 | 2 | 170 |
|  | 10 | 73 | 229 | 23 | 130 | 90 | 16 | 88 | 199 |
|  | 13 | 120 | 260 | 105 | 210 | 252 | 95 | 112 | 26 |
|  | 24 | 9 | 90 | 135 | 123 | 173 | 212 | 20 | 105 |
|  | 52 | 0 | 0 | 0 | 0 | 0 | 0 | 0 | 0 |
| 31 | 1 | 95 | 100 | 222 | 175 | 144 | 101 | 4 | 73 |
|  | 7 | 177 | 215 | 308 | 49 | 144 | 297 | 49 | 149 |
|  | 22 | 172 | 258 | 66 | 177 | 166 | 279 | 125 | 175 |
|  | 25 | 61 | 256 | 162 | 128 | 19 | 222 | 194 | 108 |
|  | 53 | 0 | 0 | 0 | 0 | 0 | 0 | 0 | 0 |
| 32 | 0 | 221 | 102 | 210 | 192 | 0 | 351 | 6 | 103 |
|  | 12 | 112 | 201 | 22 | 209 | 211 | 265 | 126 | 110 |
|  | 14 | 199 | 175 | 271 | 58 | 36 | 338 | 63 | 151 |
|  | 24 | 121 | 287 | 217 | 30 | 162 | 83 | 20 | 211 |
|  | 54 | 0 | 0 | 0 | 0 | 0 | 0 | 0 | 0 |
| 33 | 1 | 2 | 323 | 170 | 114 | 0 | 56 | 10 | 199 |
|  | 2 | 187 | 8 | 20 | 49 | 0 | 304 | 30 | 132 |
|  | 11 | 41 | 361 | 140 | 161 | 76 | 141 | 6 | 172 |
|  | 21 | 211 | 105 | 33 | 137 | 18 | 101 | 92 | 65 |
|  | 55 | 0 | 0 | 0 | 0 | 0 | 0 | 0 | 0 |
| 34 | 0 | 127 | 230 | 187 | 82 | 197 | 60 | 4 | 161 |
|  | 7 | 167 | 148 | 296 | 186 | 0 | 320 | 153 | 237 |
|  | 15 | 164 | 202 | 5 | 68 | 108 | 112 | 197 | 142 |
|  | 17 | 159 | 312 | 44 | 150 | 0 | 54 | 155 | 180 |
|  | 56 | 0 | 0 | 0 | 0 | 0 | 0 | 0 | 0 |
| 35 | 1 | 161 | 320 | 207 | 192 | 199 | 100 | 4 | 231 |
|  | 6 | 197 | 335 | 158 | 173 | 278 | 210 | 45 | 174 |
|  | 12 | 207 | 2 | 55 | 26 | 0 | 195 | 168 | 145 |
|  | 22 | 103 | 266 | 285 | 187 | 205 | 268 | 185 | 100 |
|  | 57 | 0 | 0 | 0 | 0 | 0 | 0 | 0 | 0 |
| 36 | 0 | 37 | 210 | 259 | 222 | 216 | 135 | 6 | 11 |
|  | 14 | 105 | 313 | 179 | 157 | 16 | 15 | 200 | 207 |
|  | 15 | 51 | 297 | 178 | 0 | 0 | 35 | 177 | 42 |
|  | 18 | 120 | 21 | 160 | 6 | 0 | 188 | 43 | 100 |
|  | 58 | 0 | 0 | 0 | 0 | 0 | 0 | 0 | 0 |
| 37 | 1 | 198 | 269 | 298 | 81 | 72 | 319 | 82 | 59 |
|  | 13 | 220 | 82 | 15 | 195 | 144 | 236 | 2 | 204 |
|  | 23 | 122 | 115 | 115 | 138 | 0 | 85 | 135 | 161 |
|  | 59 | 0 | 0 | 0 | 0 | 0 | 0 | 0 | 0 |
| 38 | 0 | 167 | 185 | 151 | 123 | 190 | 164 | 91 | 121 |
|  | 9 | 151 | 177 | 179 | 90 | 0 | 196 | 64 | 90 |
|  | 10 | 157 | 289 | 64 | 73 | 0 | 209 | 198 | 26 |
|  | 12 | 163 | 214 | 181 | 10 | 0 | 246 | 100 | 140 |
|  | 60 | 0 | 0 | 0 | 0 | 0 | 0 | 0 | 0 |
| 39 | 1 | 173 | 258 | 102 | 12 | 153 | 236 | 4 | 115 |
|  | 3 | 139 | 93 | 77 | 77 | 0 | 264 | 28 | 188 |
|  | 7 | 149 | 346 | 192 | 49 | 165 | 37 | 109 | 168 |
|  | 19 | 0 | 297 | 208 | 114 | 117 | 272 | 188 | 52 |
|  | 61 | 0 | 0 | 0 | 0 | 0 | 0 | 0 | 0 |
| 40 | 0 | 157 | 175 | 32 | 67 | 216 | 304 | 10 | 4 |
|  | 8 | 137 | 37 | 80 | 45 | 144 | 237 | 84 | 103 |
|  | 17 | 149 | 312 | 197 | 96 | 2 | 135 | 12 | 30 |
|  | 62 | 0 | 0 | 0 | 0 | 0 | 0 | 0 | 0 |
| 41 | 1 | 167 | 52 | 154 | 23 | 0 | 123 | 2 | 53 |
|  | 3 | 173 | 314 | 47 | 215 | 0 | 77 | 75 | 189 |
|  | 9 | 139 | 139 | 124 | 60 | 0 | 25 | 142 | 215 |
|  | 18 | 151 | 288 | 207 | 167 | 183 | 272 | 128 | 24 |
|  | 63 | 0 | 0 | 0 | 0 | 0 | 0 | 0 | 0 |
| 42 | 0 | 149 | 113 | 226 | 114 | 27 | 288 | 163 | 222 |
|  | 4 | 157 | 14 | 65 | 91 | 0 | 83 | 10 | 170 |
|  | 24 | 137 | 218 | 126 | 78 | 35 | 17 | 162 | 71 |
|  | 64 | 0 | 0 | 0 | 0 | 0 | 0 | 0 | 0 |
| 43 | 1 | 151 | 113 | 228 | 206 | 52 | 210 | 1 | 22 |
|  | 16 | 163 | 132 | 69 | 22 | 243 | 3 | 163 | 127 |
|  | 18 | 173 | 114 | 176 | 134 | 0 | 53 | 99 | 49 |
|  | 25 | 139 | 168 | 102 | 161 | 270 | 167 | 98 | 125 |
|  | 65 | 0 | 0 | 0 | 0 | 0 | 0 | 0 | 0 |

-continued

| | | $i_{LS}$ | | | | | | | |
| i | j | 1 | 2 | 3 | 4 | 5 | 6 | 7 | 8 |
|---|---|---|---|---|---|---|---|---|---|
| 44 | 0 | 139 | 80 | 234 | 84 | 18 | 79 | 4 | 191 |
|  | 7 | 157 | 78 | 227 | 4 | 0 | 244 | 6 | 211 |
|  | 9 | 163 | 163 | 259 | 9 | 0 | 293 | 142 | 187 |
|  | 22 | 173 | 274 | 260 | 12 | 57 | 272 | 3 | 148 |
|  | 66 | 0 | 0 | 0 | 0 | 0 | 0 | 0 | 0 |
| 45 | 1 | 149 | 135 | 101 | 184 | 168 | 82 | 181 | 177 |
|  | 6 | 151 | 149 | 228 | 121 | 0 | 67 | 45 | 114 |
|  | 10 | 167 | 15 | 126 | 29 | 144 | 235 | 153 | 93 |
|  | 67 | 0 | 0 | 0 | 0 | 0 | 0 | 0 | 0 |

Optionally, an embodiment of this application further provides a communication method. In the method, a code rate is determined based on an MCS index, an encoding matrix type of a first sequence is determined based on a relationship between the code rate and a first code rate threshold and/or a second code rate threshold, and the first sequence is coded based on an encoding matrix corresponding to the encoding matrix type. For determining the code rate based on the MCS index, refer to the manners (2) and (3) described in the foregoing embodiment. For a description of the first sequence, refer to the foregoing embodiment. Details are not described herein again.

A manner of determining the coding matrix type of the first sequence based on the relationship between the code rate and the first code rate threshold and/or the second code rate threshold may include at least one of the following:

A: When the code rate is greater than the first code rate threshold, the encoding matrix type of the first sequence may be determined as a first encoding matrix type.

B: When the code rate is less than the second code rate threshold, the encoding matrix type of the first sequence may be determined as a second encoding matrix type. It should be noted that, when the code rate is less than the second code rate threshold, because a maximum code block length supported by the second encoding matrix type is less than or equal to a first threshold, when the first sequence is obtained, a specific operation may be performed to make a length of the first sequence be less than or equal to the first threshold, and the operation may be usually performed in a code block segmentation operation.

C: When the code rate is less than the first code rate threshold and greater than the second code rate threshold, if a length of the first sequence is greater than a first threshold, the encoding matrix type of the first sequence may be determined as a first encoding matrix type; or if a length of the first sequence is less than or equal to a first threshold, the encoding matrix type of the first sequence may be determined as a second encoding matrix type.

It should be noted that, when the code rate is equal to the second code rate threshold, the encoding matrix type may also be determined in the manner B or C. When the code rate is equal to the first code rate threshold, the encoding matrix type may also be determined in the manner C. This is not limited in this embodiment of this application.

It may be understood that, in the foregoing manners A to C, likewise, the encoding matrix type of the first sequence is determined based on the MCS index. In conclusion, when the length of the first sequence is less than or equal to the first threshold, and the code rate is less than the first code rate threshold, the encoding matrix type of the first sequence is determined as the second encoding matrix type.

Values of the first code rate threshold and the second code rate threshold are not limited in this embodiment of this application. For example, the first code rate threshold may be 2/3, and the second code rate threshold may be 1/4.

Optionally, in the foregoing embodiments, an illustrated manner of determining the code rate based on the MCS index may be understood as that the code rate is obtained through query based on the MCS index. However, if there is a scenario of a limited cache in a system, a final code rate may be higher than the code rate obtained through the query based on the MCS index.

For the scenario of the limited cache in the system, in a possible manner of this embodiment of this application, determining the code rate based on the MCS index may include: obtaining a first code rate through the query based on the MCS index, and finally determining, as the code rate determined based on the MCS index, a larger value from the first code rate and a minimum code rate that can be supported in actual sending, which may be simply referred to as the final code rate, where the final code rate is a final code rate of actually encoding the first sequence. For example, the code rate obtained through the query based on the MCS index is 1/3. However, the minimum code rate that can be supported in actual sending is 1/2 because there is the limited cache in the system. In this case, 1/2 is determined as the final code rate. Further, referring to a manner in the foregoing embodiment, the encoding matrix type may be determined by using the final code rate.

In a possible design, in the foregoing embodiments, determining the encoding matrix type of the first sequence based on the code rate may also be determining the encoding matrix type based on the code rate and a code rate set. There is a direct correspondence or an indirect correspondence between the code rate set and the encoding matrix type, and the code rate set may be pre-defined, or may be configured by the system. The code rate set includes one or more code rates. For example, it is assumed that there are two code rate sets, a first code rate set is (1/3, 1/2), a second code rate set is (1/4, 1/5), the first code rate set corresponds to the first encoding matrix type, and the second code rate set corresponds to the second encoding matrix type. When the determined code rate is 1/4, because 1/4 corresponds to the second code rate set, it may be determined that an encoding matrix type of the code rate 1/4 is the second encoding matrix type.

Optionally, in a communications system, an LDPC code may be obtained after encoding is performed by using the foregoing method. After the LDPC code is obtained, a communications apparatus may further perform one or more of the following operations: performing rate matching on the LDPC code; performing, based on an interleaving scheme, interleaving on an LDPC code obtained after the rate matching; modulating, based on a modulation scheme, an interleaved LDPC code to obtain a bit sequence X; and sending the bit sequence X.

Decoding is an inverse process of encoding, and a base matrix used in a decoding process has a same characteristic as a base matrix used in an encoding process. For an encoding process of the LDPC code, refer to the description in the foregoing implementations. Details are not described herein again. In an implementation, before the decoding, the communications apparatus may further perform one or more of the following operations: receiving a signal obtained after the LDPC code is coded; performing demodulation, de-interleaving, and rate de-matching on the signal to obtain a soft value sequence of the LDPC code; and decoding the soft value sequence of the LDPC code.

It should be noted that the foregoing process describes an example of an encoding scheme implemented on a transmit side. Correspondingly, the decoding is performed on a receive side by using a corresponding method. For example, the encoding matrix type may be determined by using a method that is the same as that on the transmit side, and the encoding matrix is further determined, so as to complete the decoding. The decoding may be implemented by using a communications apparatus, and is performed on the receive side.

Corresponding to the communication method provided in FIG. 2, an embodiment of this application further provides a corresponding communications apparatus. The communications apparatus includes a corresponding module configured to perform each part in FIG. 2. The module may be software, or may be hardware, or may be a combination of software and hardware.

Figure 4:
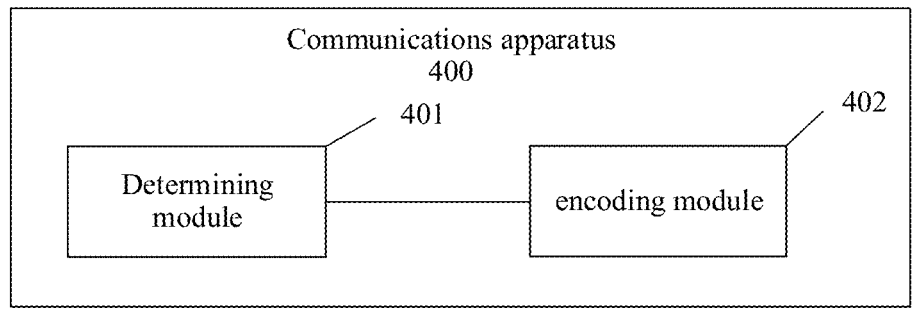
FIG. 4 is a schematic structural diagram of a communications apparatus according to an embodiment of this application.

As shown in FIG. 4, an embodiment of this application provides a communications apparatus 400. The communications apparatus 400 may include a determining module 401 and an encoding module 402.

The determining module 401 is configured to determine an encoding matrix type based on at least a length of a first sequence. Further, when the length of the first sequence is greater than a first threshold, the encoding matrix type may be determined as a first encoding matrix type. When the length of the first sequence is less than or equal to a first threshold, the encoding matrix type may be determined based on an MCS index.

Alternatively, the determining module 401 determines a code rate based on the MCS index, and further determines the encoding matrix type based on the code rate and the length of the first sequence.

The encoding module 402 is configured to encode the first sequence based on an encoding matrix corresponding to the encoding matrix type determined by the determining module 401.

It should be noted that, for a corresponding processing procedure and an implementation of each module in the communications apparatus shown in FIG. 4, refer to corresponding descriptions in the method embodiment. Details are not described herein again. In a possible design, one or more modules in FIG. 4 may be implemented by one or more processors, or may be implemented by one or more processors and memories.

Figure 5:
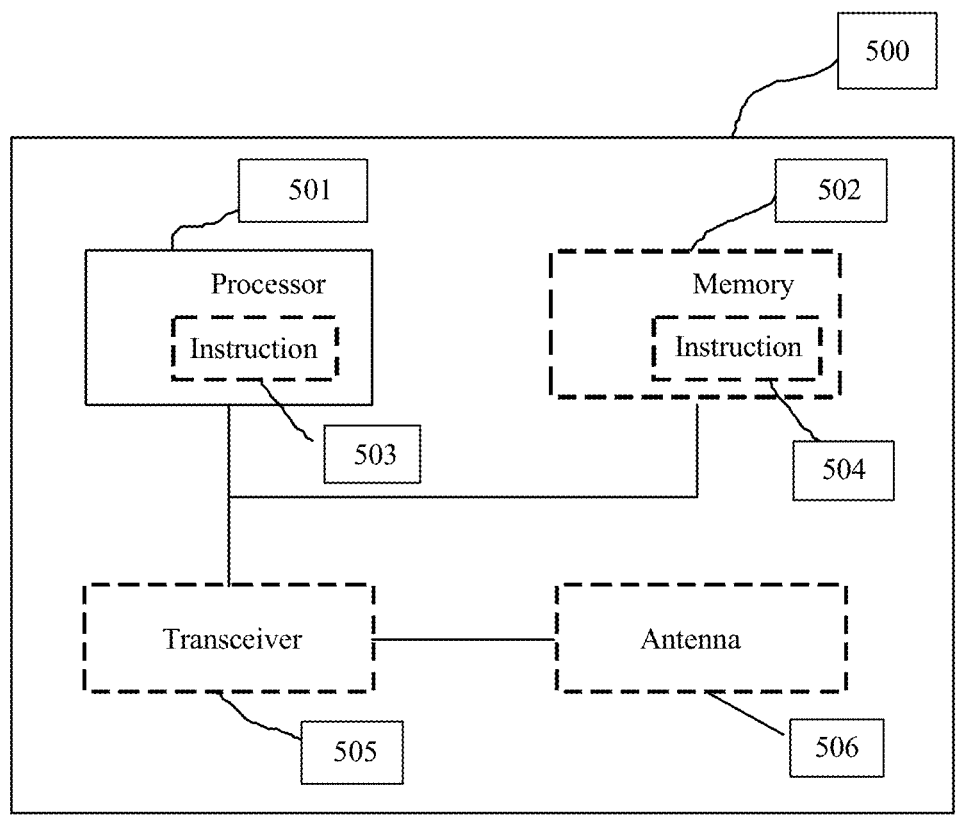
FIG. 5 is a schematic structural diagram of a communications apparatus according to another embodiment of this application.

FIG. 5 further provides a communications apparatus 500, and the communications apparatus 500 may include one or more processors 501. The one or more processors may implement the method shown in FIG. 2 and the methods in the foregoing other embodiments.

The processor 501 may be a general-purpose processor, a dedicated processor, or the like. For example, the processor 501 may be a baseband processor or a central processing unit. The baseband processor may be configured to process a communication protocol and communication data. The central processing unit may be configured to: control the communications apparatus (such as a base station, a terminal, or a chip), execute a software program, and process data of the software program.

The communications apparatus may include a transceiver module, configured to implement input (receiving) and output (sending) of a signal. For example, the communications apparatus may be a chip, and the transceiver module may be an input and/or output circuit or a communications interface of the chip. The chip may be used by a terminal, a base station, or another network device. For another example, the communications apparatus may be a terminal, a base station, or another network device, and the transceiver unit may be a transceiver or a radio frequency chip.

In a possible design, the communications apparatus 500 includes the one or more processors 501, and the one or more processors 501 may implement the foregoing encoding function. For example, the communications apparatus may be an encoder. In another possible design, in addition to the encoding function, the processor 501 may further implement another function.

The processor 501 may be configured to implement corresponding functions of the determining module 401 and the encoding module 402 in the foregoing embodiment.

In a possible design, the communications apparatus 500 includes a means for determining an encoding matrix type based on a length of a to-be-coded sequence, and a means for encoding the to-be-coded sequence based on an encoding matrix corresponding to the encoding matrix type. These functions may be implemented by using one or more processors. For details, refer to the descriptions in the foregoing method embodiment.

In a possible design, the communications apparatus 500 may include a means for determining a code rate based on an MCS index, a means for determining an encoding matrix type based on the code rate and a length of a first sequence, and a means for encoding the to-be-coded first sequence based on an encoding matrix corresponding to the encoding matrix type. For example, these functions may be implemented by using one or more processors. For details, refer to the descriptions in the foregoing method embodiment.

In another possible design, the communications apparatus 500 may alternatively include a circuit. The circuit may implement the functions in the foregoing method embodiment. For example, the communications apparatus 500 includes a circuit for determining an encoding matrix type based on a length of a to-be-coded sequence, and a circuit for encoding the to-be-coded sequence based on an encoding matrix corresponding to the encoding matrix type. Alternatively, the communications apparatus 500 may include a circuit for determining a code rate based on an MCS index, a circuit for determining an encoding matrix type based on the code rate and a length of a first sequence, and a circuit for encoding the to-be-coded first sequence based on an encoding matrix corresponding to the encoding matrix type.

Optionally, in a design, the processor 501 may include an instruction 503 (sometimes also referred to as code or a program). The instruction may run on the processor, so that the communications apparatus 500 performs the method described in the foregoing embodiment.

Optionally, in a design, the communications apparatus 500 may include one or more memories 502. The one or more memories 502 store an instruction 504. The instruction may run on the processor, so that the communications apparatus 500 performs the method described in the foregoing method embodiment. For example, the memory may store necessary instructions or data. For example, various parameters and correspondences mentioned in the foregoing method embodiment may be stored.

Optionally, the memory may further store data. Optionally, the processor may further store an instruction and/or data. The processor and the memory may be separately disposed, or may be integrated together.

Optionally, the "storage", "storage", or "pre-storage" in the foregoing embodiment may be storage in the memory 502, or storage in another peripheral memory or storage device.

Optionally, the communications apparatus 500 may further include a transceiver 505 and an antenna 506. The processor 501 may be referred to as a processing unit. The processor 501 controls the communications apparatus. The transceiver 505 may be referred to as a transceiver unit, a transceiver, a transceiver circuit, a transceiver, or the like, and is configured to implement sending and receiving functions of the communications apparatus by using the antenna 506. When the communications apparatus is a terminal, the transceiver 505 may be configured to receive an MCS index from a base station.

Optionally, the communications apparatus 500 may further include a component configured to generate a transport block CRC, a component configured to perform code block segmentation and CRC check, an interleaver configured to perform interleaving, a component configured to perform rate matching, a modulator configured to perform modulation processing, or the like. Functions of these components may be implemented by the one or more processors 501.

Optionally, the communications apparatus 500 may further include a demodulator configured to perform a demodulation operation, a de-interleaver configured to perform de-interleaving, a component configured to perform rate de-matching, a component configured to perform code block cascading and CRC check, or the like. Functions of these components may be implemented by the one or more processors 501.

In another possible design, an embodiment of this application further provides a communications apparatus. The communications apparatus may include a circuit, and the circuit may implement corresponding functions of the determining module 401 and the encoding module 402 in the foregoing embodiment.

Figure 6:
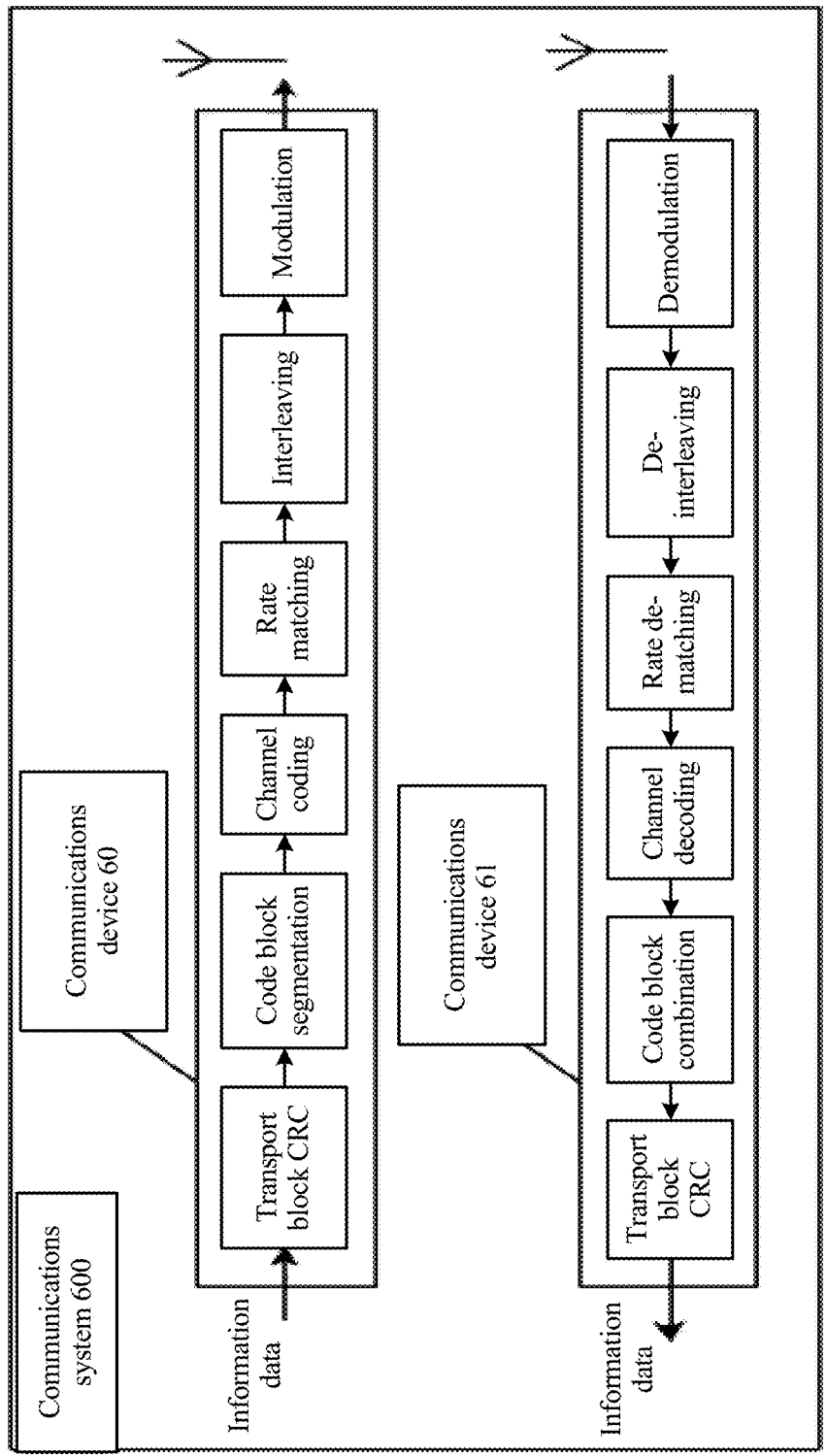
FIG. 6 is a schematic diagram of a communications system according to an embodiment of this application.

FIG. 6 is a schematic diagram of a communications system 600. The communications system 600 includes a communications device 60 and a communications device 61. The communications device 60 and the communications device 61 receive information data from each other and send information data to each other. The communications device 60 and the communications device 61 may be the communications apparatus 500 or the communications apparatus 400, or either of the communications device 60 and the communications device 61 includes the communications apparatus 500 or the communications apparatus 400, and receives and/or sends information data. For example, the communications device 60 may be a terminal, and correspondingly, the communications device 61 may be a base station. For another example, the communications device 60 is a base station, and correspondingly, the communications device 61 may be a terminal.

A person skilled in the art may further understand that the various illustrative logical blocks and steps listed in the embodiments of this application may be implemented by using electronic hardware, computer software, or a combination thereof. Whether the functions are implemented by using hardware or software depends on particular applications and a design requirement of an entire system. A person skilled in the art may use various methods to implement the described functions for each particular application, but it should not be considered that the implementation goes beyond the scope of the embodiments of this application.

The technologies described in this application may be implemented in various manners. For example, these technologies may be implemented in a manner of hardware, software, or a combination of hardware and software. For implementation by using the hardware, a processing unit configured to execute these technologies at a communications apparatus (such as a base station, a terminal, a network entity, or a chip) may be implemented in one or more general-purpose processors, a digital signal processor (DSP), a digital signal processing device (DSPD), an application-specific integrated circuit (ASIC), a programmable logic device (PLD), a field-programmable gate array (FPGA), or another programmable logic apparatus, a discrete gate or transistor logic, a discrete hardware component, or any combination thereof. The general-purpose processor may be a microprocessor. Optionally, the general-purpose processor may be alternatively any conventional processor, controller, microcontroller, or state machine. The processor may be alternatively implemented by a combination of computing apparatuses, such as a digital signal processor and a microprocessor, a plurality of microprocessors, one or more microprocessors together with a digital signal processor core, or any other similar configuration.

Steps of the methods or algorithms described in the embodiments of this application may be directly embedded into hardware, an instruction executed by a processor, or a combination thereof. The memory may be a RAM memory, a flash memory, a ROM memory, an EPROM memory, an EEPROM memory, a register, a hard disk, a removable magnetic disk, a CD-ROM, or a storage medium of any other form in the art. For example, the memory may connect to a processor so that the processor may read information from the memory and write information to the memory. Alternatively, the memory may be integrated into a processor. The processor and the memory may be disposed in an ASIC, and the ASIC may be disposed in a terminal. Optionally, the processor and the memory may be disposed in different components of the terminal.

All or some of the foregoing embodiments may be implemented by using software, hardware, firmware, or any combination thereof. When software is used to implement the embodiments, the embodiments may be all or partially implemented in a form of a computer program product. The computer program product includes one or more computer instructions. When the computer program instructions are loaded and executed on a computer, the procedures or functions according to the embodiments of this application are all or partially generated. The computer may be a general-purpose computer, a dedicated computer, a computer network, or another programmable apparatus. The computer instructions may be stored in a computer-readable storage medium or transmitted from a computer-readable storage medium to another computer-readable storage medium. For example, the computer instructions may be transmitted from a website, computer, server, or data center to another website, computer, server, or data center in a wired (e.g., a coaxial cable, an optical fiber, or a digital subscriber line (DSL)) or wireless (e.g., infrared, radio, or microwave) manner. The computer-readable storage medium may be any usable medium accessible by a computer, or a data storage device, such as a server or a data center, integrating one or more usable media. The usable medium may be a magnetic medium (e.g., a floppy disk, a hard disk, or a magnetic tape), an optical medium (e.g., a DVD), a semiconductor medium (e.g., a solid state disk (SSD)), or the like. The foregoing combination should also be included in the protection scope of the computer-readable medium.

For same or similar parts in the embodiments of this specification, refer to these embodiments.

The foregoing descriptions are implementations of this application, but are not intended to limit the protection scope of this application.

What is claimed is:

1. A communication method, applied to a communication apparatus, the method comprising:
    determining, based on a correspondence between a modulation and coding scheme (MCS) index and a first code rate value, the first code rate value associated with the MCS index;
    determining an encoding matrix type based on:
        the first code rate value associated with the MCS index, and
        a code rate threshold; and
    encoding a first sequence based on an encoding matrix associated with the encoding matrix type,
    wherein a length of the first sequence is less than or equal to a first threshold,
    wherein the communication apparatus operates with a limited cache capacity, and
    wherein the first code rate value associated with the MCS index is a larger value of:
        a code rate based on the MCS index, and
        a minimum code rate supported in actual sending using the limited cache capacity.

2. The method according to claim 1, wherein the first sequence is obtained after code block segmentation is performed on a second sequence, and a length of the second sequence is related to the MCS index.

3. The method according to claim 1, wherein the determining the encoding matrix type based on the first code rate value associated with the MCS index and the code rate threshold comprises:
    first determining that the first code rate value is greater than the code rate threshold, determining, in accordance with the first determining, that the encoding matrix type is a first encoding matrix type;
    wherein the method further comprises:
    determining, based on a correspondence between the MCS index and a second code rate value, the second code rate value associated with the MCS index;
    determining an encoding matrix type based on the second code rate value associated with the MCS index and the code rate threshold, including: second determining that the second code rate value is less than or equal to the code rate threshold, determining, in accordance with the second determining, that the encoding matrix type is a second encoding matrix type;
    wherein a size of an encoding matrix corresponding to the first encoding matrix type is greater than a size of an encoding matrix corresponding to the second encoding matrix type.

4. The method according to claim 1, wherein the first code rate value is determined based on the MCS index in a table lookup manner.

5. The method according to claim 1, wherein the encoding matrix type comprises at least one of: a base graph type and a parity check matrix type.

6. The method according to claim 1, further comprising: storing one or more of the following items:
    a correspondence between the MCS index and the encoding matrix type;
    the correspondence between the MCS index and the first code rate value; and
    a correspondence among the MCS index, the first code rate value, and the encoding matrix type.

7. The method according to claim 3, further comprising storing one or more items taken from the group consisting of:
    a correspondence between the MCS index and the encoding matrix type;
    the correspondence between the MCS index and the second code rate value; and
    a correspondence among the MCS index, the second code rate value, and the encoding matrix type.

8. A communications apparatus, comprising:
    a first circuitry, configured to:
        determine, based on a correspondence between a modulation and coding scheme (MCS) index and a first code rate value, the first code rate value associated with the MCS index, and
        determine a coding matrix type based on:
            the code rate value associated with the MCS index, and
            a code rate threshold; and
    a second circuitry, configured to:
        encode a first sequence based on a encoding matrix associated with the encoding matrix type,
    wherein a length of the first sequence is less than or equal to a first threshold,
    wherein the communication apparatus operates with a limited cache capacity, and
    wherein the first code rate value associated with the MCS index is a larger value of:
        a code rate based on the MCS index, and
        a minimum code rate supported in actual sending using the limited cache capacity.

9. The apparatus according to claim 8, wherein the first sequence is obtained after code block segmentation is performed on a second sequence, and a length of the second sequence is related to the MCS index.

10. The apparatus according to claim 8, wherein the first circuitry is further configured to:
    when first determine the code rate value is greater than the code rate threshold, determine, in accordance with the first determining, that the encoding matrix type is a first coding matrix type; and
    second determine the code rate value is less than or equal to the code rate threshold, determine, in accordance with the second determining, that the encoding matrix type is a second encoding matrix type, wherein a size of an encoding matrix corresponding to the first encoding matrix type is greater than a size of an encoding matrix corresponding to the second encoding matrix type.

11. The apparatus according to claim 8, wherein the first circuitry is configured to determine the code rate value based on the MCS index in a table lookup manner.

12. The apparatus according to claim 8, wherein the encoding matrix type comprises at least one of: a base graph type and a parity check matrix type.

13. The apparatus according to claim 8, further comprising a memory, configured to store one or more of the following items:
    a correspondence between the MCS index and the encoding matrix type;
    the correspondence between the MCS index and the code rate value; and
    a correspondence among the MCS index, the code rate value, and the encoding matrix type.

14. A non-transitory computer-readable storage medium, comprising an instruction, which when run by a communications apparatus, causes the communications apparatus to perform operations including:

determining, based on a correspondence between a modulation and encoding scheme (MCS) index and a code rate value, the code rate value associated with the MCS index;

determining an encoding matrix type based on:
the code rate value associated with the MCS index, and
a code rate threshold; and encoding a first sequence based on an encoding matrix associated with the encoding matrix type,
wherein a length of the first sequence is less than or equal to a first threshold,
wherein the communication apparatus operates with a limited cache capacity, and
wherein the first code rate value associated with the MCS index is a larger value of:
a code rate based on the MCS index, and
a minimum code rate supported in actual sending using the limited cache capacity.

15. The medium according to claim 14, wherein the first sequence is obtained after code block segmentation is performed on a second sequence, and a length of the second sequence is related to the MCS index.

16. The medium according to claim 14, wherein the operation of determining the encoding matrix type based on the code rate value associated with the MCS index and the code rate threshold comprises:

first determining the code rate value is greater than the code rate threshold, determining, in accordance with the first determining, that the encoding matrix type is a first encoding matrix type; and second determining the code rate value is less than or equal to the code rate threshold, determining, in accordance with the second determining, that the encoding matrix type is a second encoding matrix type, wherein a size of an encoding matrix associated with the first encoding matrix type is greater than a size of an encoding matrix associated with the second encoding matrix type.

17. The medium according to claim 14, wherein the code rate value is determined based on the MCS index in a table lookup manner.

18. The medium according to claim 14, wherein the encoding matrix type comprises at least one of: a base graph type and a parity check matrix type.

19. The medium according to claim 14, wherein the operations further comprise storing one or more items taken from the group consisting of:
a correspondence between the MCS index and the encoding matrix type;
the correspondence between the MCS index and the code rate; and
a correspondence among the MCS index, the code rate, and the encoding matrix type.

* * * * *